US009542285B2

(12) United States Patent
Miyazaki et al.

(10) Patent No.: US 9,542,285 B2
(45) Date of Patent: Jan. 10, 2017

(54) MEMORY DEVICE, STORAGE METHOD AND CONTROL DEVICE

(71) Applicant: FUJITSU LIMITED, Kawasaki-shi, Kanagawa (JP)

(72) Inventors: Sadao Miyazaki, Kawasaki (JP); Osamu Ishibashi, Kawasaki (JP); Jin Abe, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 113 days.

(21) Appl. No.: 14/574,443

(22) Filed: Dec. 18, 2014

(65) Prior Publication Data

US 2015/0199246 A1    Jul. 16, 2015

(30) Foreign Application Priority Data

Jan. 16, 2014    (JP) .................. 2014-006262

(51) Int. Cl.
G06F 11/20 (2006.01)
G11C 29/44 (2006.01)
G11C 29/24 (2006.01)

(52) U.S. Cl.
CPC .......... *G06F 11/2094* (2013.01); *G11C 29/24* (2013.01); *G11C 29/44* (2013.01); *G06F 2201/85* (2013.01)

(58) Field of Classification Search
CPC .............. G06F 11/2094; G06F 2201/85; G06F 11/1008; G06F 11/1666; G06F 11/261; G06F 2201/81; G06F 2212/1036; G06F 2212/7211; G11C 29/24; G11C 29/44; G11C 29/50016
See application file for complete search history.

(56) References Cited

U.S. PATENT DOCUMENTS

| 5,392,246 A * | 2/1995 | Akiyama ............... G11C 29/24 365/189.07 |
| 5,491,664 A * | 2/1996 | Phelan ................. G11C 29/808 365/200 |
| 6,625,071 B2 * | 9/2003 | Ikeda ..................... G11C 29/88 365/185.09 |
| 7,120,777 B2 * | 10/2006 | Adelmann .............. G06F 21/73 711/170 |
| 7,454,670 B2 * | 11/2008 | Kim .................... G06F 12/0246 711/E12.008 |
| 7,941,593 B2 * | 5/2011 | Lee ........................ G06F 9/4403 711/103 |

(Continued)

FOREIGN PATENT DOCUMENTS

| JP | 2002-319296 | 10/2002 |
| JP | 2011-159192 | 8/2011 |

*Primary Examiner* — Nadeem Iqbal
(74) *Attorney, Agent, or Firm* — Fujitsu Patent Center

(57) ABSTRACT

A memory device includes a storage unit in which a plurality of semiconductor chips each comprising a plurality of memory blocks respectively arranged in a planar direction and a plurality of redundant blocks respectively arranged in a planar direction are stacked, a detecting unit configured to detect a defect of each of the memory blocks in the storage unit; a checking unit configured to check free capacity in each of the redundant blocks in the storage unit, and a determining unit configured to determine a substitute block to be substituted for the memory block in which the defect has been detected from the redundant blocks having the free capacity.

9 Claims, 20 Drawing Sheets

(56) References Cited

U.S. PATENT DOCUMENTS

| | | | | |
|---|---|---|---|---|
| 2002/0105840 A1* | 8/2002 | Ikeda | ............ | G11C 29/88 |
| | | | | 365/200 |
| 2002/0154559 A1 | 10/2002 | Shionoya | | |
| 2005/0149687 A1* | 7/2005 | Adelmann | ............ | G06F 21/73 |
| | | | | 711/170 |
| 2009/0257297 A1* | 10/2009 | Park | ............ | G11C 5/005 |
| | | | | 365/200 |
| 2014/0347943 A1* | 11/2014 | Kim | ............ | G11C 29/006 |
| | | | | 365/200 |

* cited by examiner

FIG. 6

| ITEM | NAME OF MEMORY UNIT | ID OF MEMORY UNIT | NAME OF REDUNDANT UNIT | ID OF REDUNDANT UNIT |
|---|---|---|---|---|
| 1 | MEMORY UNIT 32-1-1-1 | MEM XXXXX111 | | |
| 2 | MEMORY UNIT 32-1-1-2 | MEM XXXXX112 | | |
| ... | ... | ... | | |
| N | MEMORY UNIT 32-1-1-N | MEM XXXXX11N | | |
| 1001 | | | REDUNDANT UNIT 33-1-1 | EXPAND XXXXXX11 |
| 1002 | | | REDUNDANT UNIT 33-1-2 | EXPAND XXXXXX12 |
| ... | | | ... | ... |
| 100N | | | REDUNDANT UNIT 33-1-N | EXPAND XXXXXX1N |

FIG. 8

| ITEM | NAME OF MEMORY UNIT | ID OF MEMORY UNIT | NAME OF REDUNDANT UNIT | G | STATE OF USE OF REDUNDANT UNIT | ID OF REDUNDANT UNIT | STATE OF USE OF REDUNDANT BLOCK UNIT |
|---|---|---|---|---|---|---|---|
| 111 | MEMORY UNIT 32-1-1-1 | MEM XXXXX111 | | 1 | | | |
| 112 | MEMORY UNIT 32-1-1-2 | MEM XXXXX112 | | 1 | | | |
| ... | ... | ... | | 1 | | | |
| 11N | MEMORY UNIT 32-1-1-N | MEM XXXXX11N | | 1 | | | |
| 11N1 | | | REDUNDANT UNIT 33-1-1 | | | | |

FIG. 10

| ITEM | NAME OF MEMORY UNIT | ID OF MEMORY UNIT | NAME OF REDUNDANT UNIT | G | STATE OF USE OF REDUNDANT UNIT | ID OF REDUNDANT UNIT | STATE OF USE OF REDUNDANT BLOCK UNIT |
|---|---|---|---|---|---|---|---|
| 111 | MEMORY UNIT 32-1-1-1 | MEM XXXXX111 | | 1 | | | IN USE |
| 112 | MEMORY UNIT 32-1-1-2 | MEM XXXXX112 | | 1 | | | |
| ... | ... | ... | | ... | | | |
| 11N | MEMORY UNIT 32-1-1-N | MEM XXXXX11N | | 1 | | | |
| 11N1 | | | REDUNDANT UNIT 33-1-1 | 1 | | | |

FIG. 11

| ITEM | NAME OF MEMORY UNIT | ID OF MEMORY UNIT | NAME OF REDUNDANT UNIT | G | STATE OF USE OF REDUNDANT UNIT | ID OF REDUNDANT UNIT | STATE OF USE OF REDUNDANT BLOCK UNIT |
|---|---|---|---|---|---|---|---|
| 111 | MEMORY UNIT 32-1-1-1 | MEM XXXXX111 | | 1 | REDUNDANT UNIT 33-1-1 | EXPAND XXXXXX11 | NO FREE CAPACITY |
| 112 | MEMORY UNIT 32-1-1-2 | MEM XXXXX112 | | 1 | | | |
| ... | ... | ... | | 1 | | | |
| 11N | MEMORY UNIT 32-1-1-N | MEM XXXXX11N | | 1 | | | |
| 11N1 | | | REDUNDANT UNIT 33-1-1 | | | | |

FIG. 14

| ITEM | NAME OF MEMORY UNIT | ID OF MEMORY UNIT | NAME OF REDUNDANT UNIT | G | STATE OF USE OF REDUNDANT UNIT | ID OF REDUNDANT UNIT | STATE OF USE OF REDUNDANT BLOCK UNIT | STATE OF USE OF OTHER MEMORY UNIT | ID OF OTHER MEMORY UNIT |
|---|---|---|---|---|---|---|---|---|---|
| 111 | MEMORY UNIT 32-1-1-1 | MEM XXXXX111 | | 1 | | | NO FREE CAPACITY | MEMORY UNIT 32-1-1-2 | MEM XXXXX112 |
| 112 | MEMORY UNIT 32-1-1-2 | MEM XXXXX112 | | 1 | | | | | |
| ... | ... | ... | | ... | | | | | |
| 11N | MEMORY UNIT 32-1-1-N | MEM XXXXX11N | | 1 | | | | | |
| 11N1 | | | REDUNDANT UNIT 33-1-1 | 1 | | | | | |

FIG. 15

| ITEM | NAME OF MEMORY UNIT | ID OF MEMORY UNIT | NAME OF REDUNDANT UNIT | G | STATE OF USE OF REDUNDANT UNIT | ID OF REDUNDANT UNIT | STATE OF USE OF REDUNDANT BLOCK UNIT | STATE OF USE OF OTHER MEMORY UNIT | ID OF OTHER MEMORY UNIT |
|---|---|---|---|---|---|---|---|---|---|
| 111 | MEMORY UNIT 32-1-1-1 | MEM XXXXX111 | | 1 | REDUNDANT UNIT 33-1-1 | EXPAND XXXXX11 | NO FREE CAPACITY | | |
| 112 | MEMORY UNIT 32-1-1-2 | MEM XXXXX112 | | 1 | | | NO FREE CAPACITY | | |
| ... | ... | ... | | ... | | | | | |
| 11N | MEMORY UNIT 32-1-1-N | MEM XXXXX11N | | 1 | | | NO FREE CAPACITY | | |
| 11N1 | | | REDUNDANT UNIT 33-1-1 | 1 | | | | | |

MEMORY DEVICE, STORAGE METHOD AND CONTROL DEVICE

CROSS-REFERENCE TO RELATED APPLICATIONS

This application is based upon and claims the benefit of prior Japanese Patent Application No. 2014-6262 filed on Jan. 16, 2014, the entire contents of which are incorporated herein by reference.

FIELD

Embodiments relate to a memory device, a storage method and a control device.

BACKGROUND

In accordance with downsizing of an information processing device such as a personal computer, there is a need for downsizing of a main memory. Memories which meet the need for downsizing of the main memory include a three-dimensional stacked memory (a 3D memory).

[Patent document 1] Japanese Laid-open Patent Publication No. 2011-159192
[Patent document 2] Japanese Laid-open Patent Publication No. 2002-319296

SUMMARY

According to an aspect of the embodiments, a memory device includes a storage unit in which a plurality of semiconductor chips each comprising a plurality of memory blocks respectively arranged in a planar direction and a plurality of redundant blocks respectively arranged in a planar direction are stacked, a detecting unit configured to detect a defect of each of the memory blocks in the storage unit, a checking unit configured to check free capacity in each of the redundant blocks in the storage unit, and a determining unit configured to determine a substitute block to be substituted for the memory block in which the defect has been detected from the redundant blocks having the free capacity.

The object and advantages of the embodiment will be realized and attained by means of the elements and combinations particularly pointed out in the claims. It is to be understood that both the foregoing general description and the following detailed description are exemplary and explanatory and are not restrictive of the embodiment, as claimed.

BRIEF DESCRIPTION OF THE DRAWINGS

FIG. 6 illustrates an example of a configuration table;
FIG. 8 illustrates an example of a management table;
FIG. 10 illustrates an example of updating processing of the management table;
FIG. 11 illustrates an example of updating processing of the management table;
FIG. 14 illustrates an example of updating processing of the management table;
FIG. 15 illustrates an example of updating processing of the management table.

DESCRIPTION OF EMBODIMENTS

The embodiments will be described below with reference to the drawings. Configurations in the embodiments are merely for illustrative purpose and are not intended to limit the configuration of the device of the embodiments. A specific configuration according to the embodiments can be employed as appropriate when the configuration of the device of the embodiments is implemented.

When a defect has occurred at a stacked memory, the stacked memory at which the defect has occurred is replaced. A defect of the stacked memory occurs as a result of occurrence of a defective block (a defective area) in which data is unstorable, in a memory block (storage area) unit of the stacked memory.

Because the stacked memory is soldered to a substrate, if a defect occurs at the stacked memory, the stacked memory is removed from the substrate by way of reflow processing. There is therefore a problem that the stacked memory is not easily replaceable when a defect has occurred at the stacked memory. It is requested to, even if a defect has occurred at the stacked memory, continue operation of the stacked memory without replacing the stacked memory.

There is a method in which a specific redundant block is substituted for a memory block unit at which a defect has occurred, so that operation of the stacked memory can be continued. With this method, there is a problem that if there is no free capacity in a specific redundant block, it is impossible to continue the operation of the stacked memory.

Figure 1:
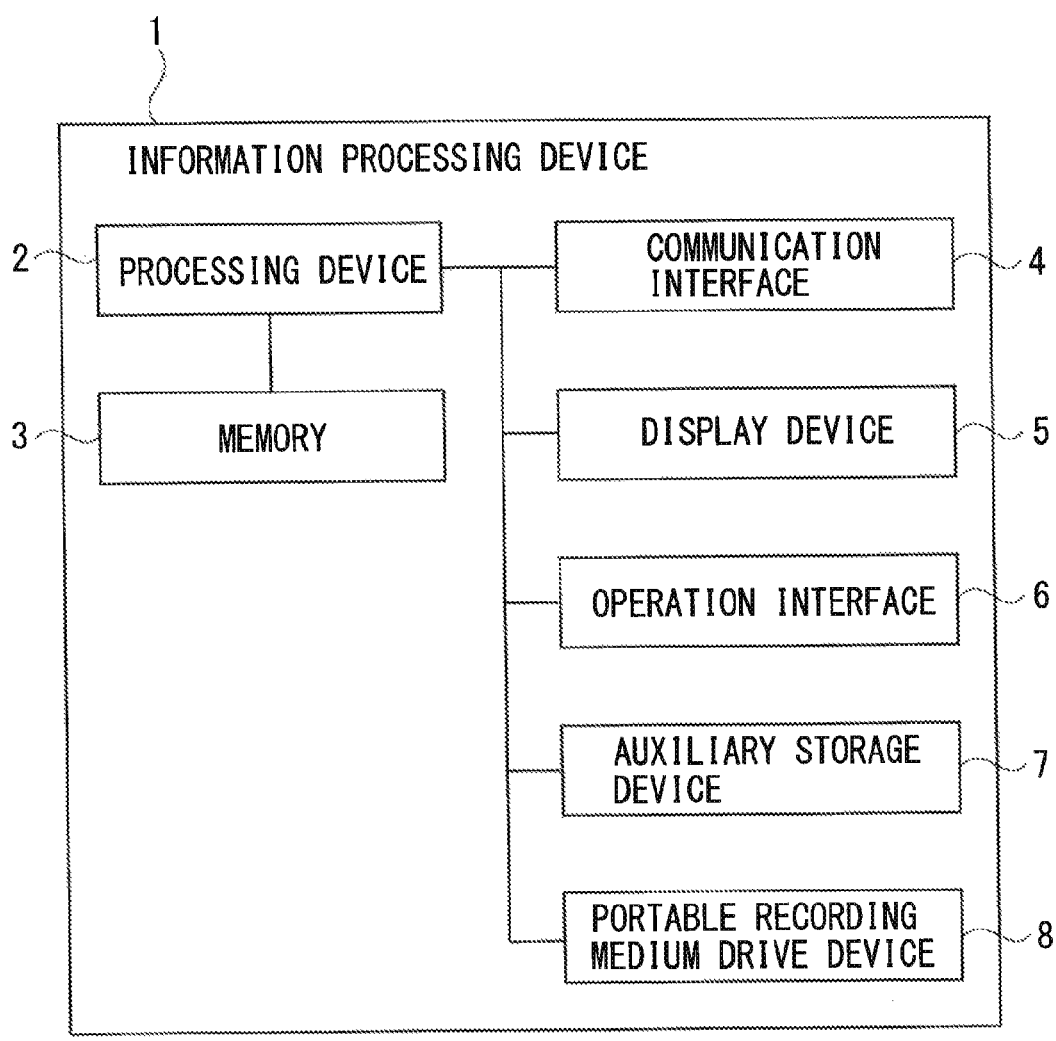
FIG. 1 illustrates an example of a hardware configuration of an information processing device.

FIG. 1 illustrates an example of a hardware configuration of an information processing device 1. The information processing device 1 is, for example, electronic equipment such as a PC (Personal Computer), a PDA (Personal Digital Assistant), a smartphone, a tablet computer, a mobile phone terminal, an electronic book reader and a game device.

The information processing device 1 includes a processing device 2, a memory 3, a communication interface 4, a display device 5, an operation interface 6, an auxiliary storage device 7 and a portable recording medium drive device 8. These are connected to one another through a bus.

The components of the information processing device 1 illustrated in FIG. 1 are merely examples, and components of the information processing device 1 can be added or deleted as appropriate when the information processing device 1 is implemented.

Figure 2:
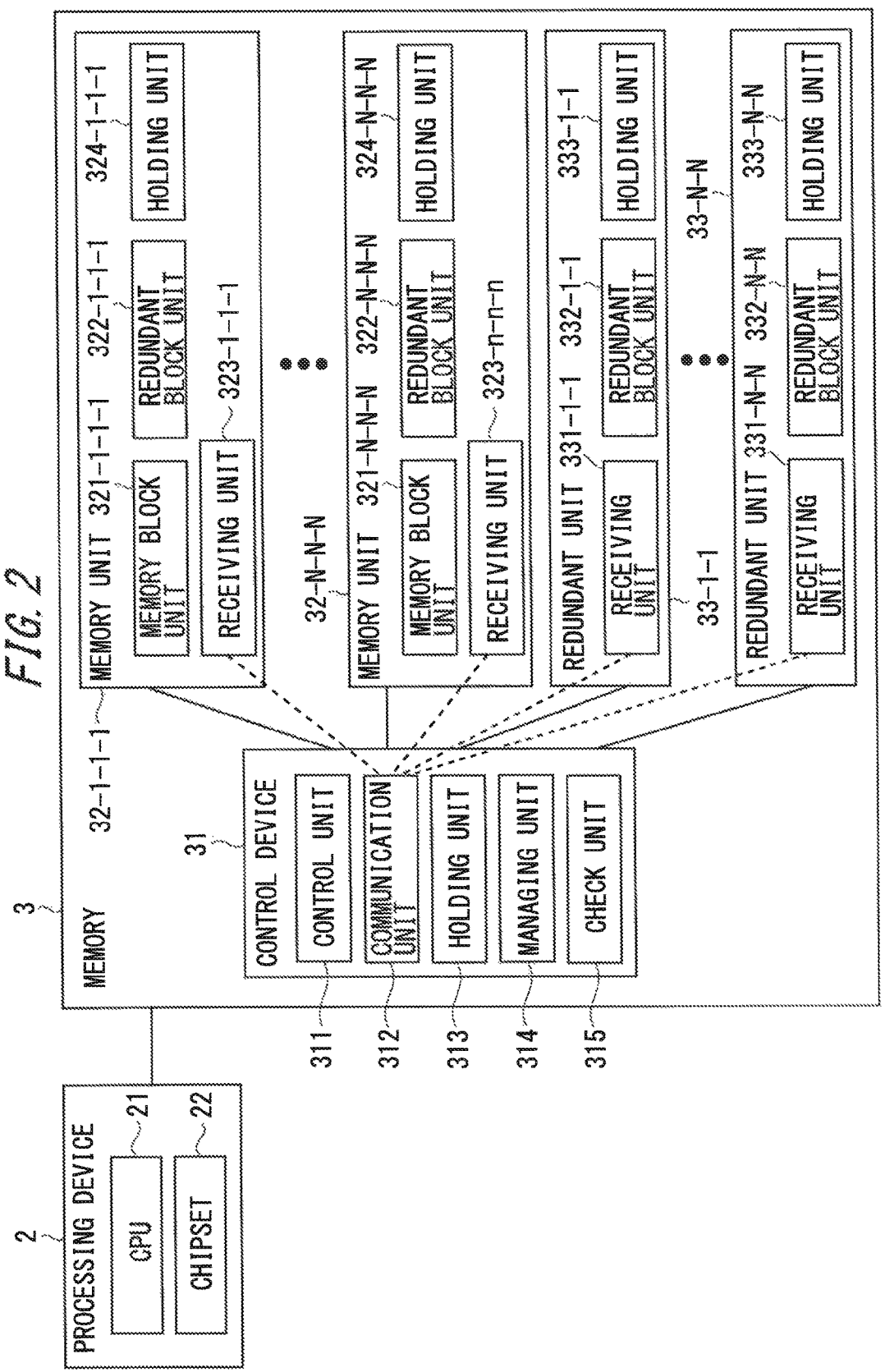
FIG. 2 illustrates an example of a memory system of the information processing device.

FIG. 2 illustrates an example of a memory system of the information processing device 1. The processing device 2 has a CPU (Central Processing Unit) 21 and a chipset 22. The CPU 21 is connected to the chipset 22, and connected to the memory 3 via the chipset 22. The CPU 21, for example, carries out operation processing while performing reading, deletion or writing of data between the CPU 21 and the memory 3 via the chipset 22.

Figure 3:
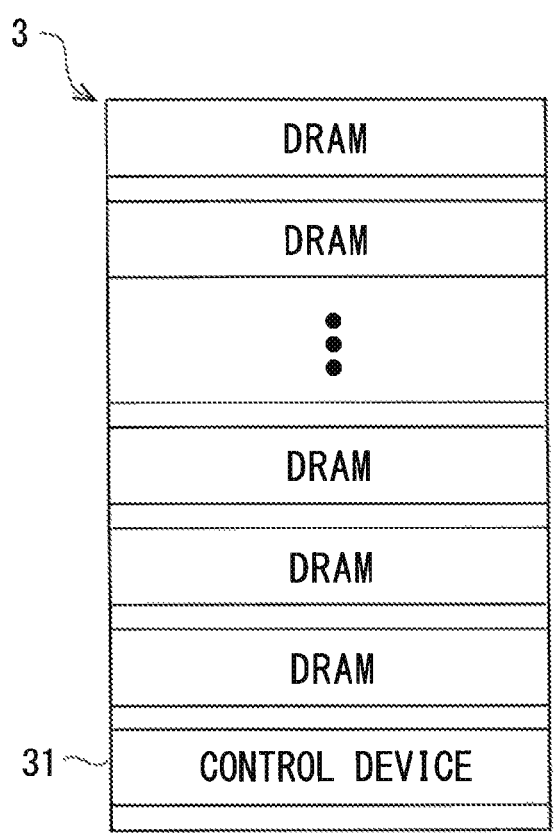
FIG. 3 is a schematic diagram illustrating a case where a three-dimensional stacked memory is used as a memory.

The memory 3 is a main memory (a main storage device) of the information processing device 1, and, for example, as illustrated in FIG. 3, a three-dimensional stacked memory in which a plurality of DRAM (Dynamic Random Access Memory) chips are stacked can be used. The memory 3 is an example of a "memory device". The DRAM chip is an example of a "semiconductor chip". FIG. 3 is a schematic diagram illustrating a case where a three-dimensional stacked memory is used as the memory 3. As illustrated in FIG. 3, the memory 3 has a plurality of DRAM chips stacked therein. The memory 3 is connected to the CPU 21 via the chipset 22, and reading, deletion and writing of data is performed by the CPU 21.

The memory 3 has a control device 31, a plurality of memory units 32-1-1-1 to 32-N-N-N and a plurality of redundant units 33-1-1 to 33-N-N.

In the following description, all of the memory units 32-1-1-1 to 32-N-N-N may be described as the memory units 32. One of the memory units 32-1-1-1 to 32-N-N-N may be described as the memory unit 32. Each of the memory units 32-1-1-1 to 32-N-N-N may be described as each memory unit 32. All of the redundant units 33-1-1 to 33-N-N may be described as the redundant units 33. One of the redundant units 33-1-1 to 33-N-N may be described as the redundant unit 33. Each of the redundant units 33-1-1 to 33-N-N may be described as each redundant unit 33.

Figure 4:
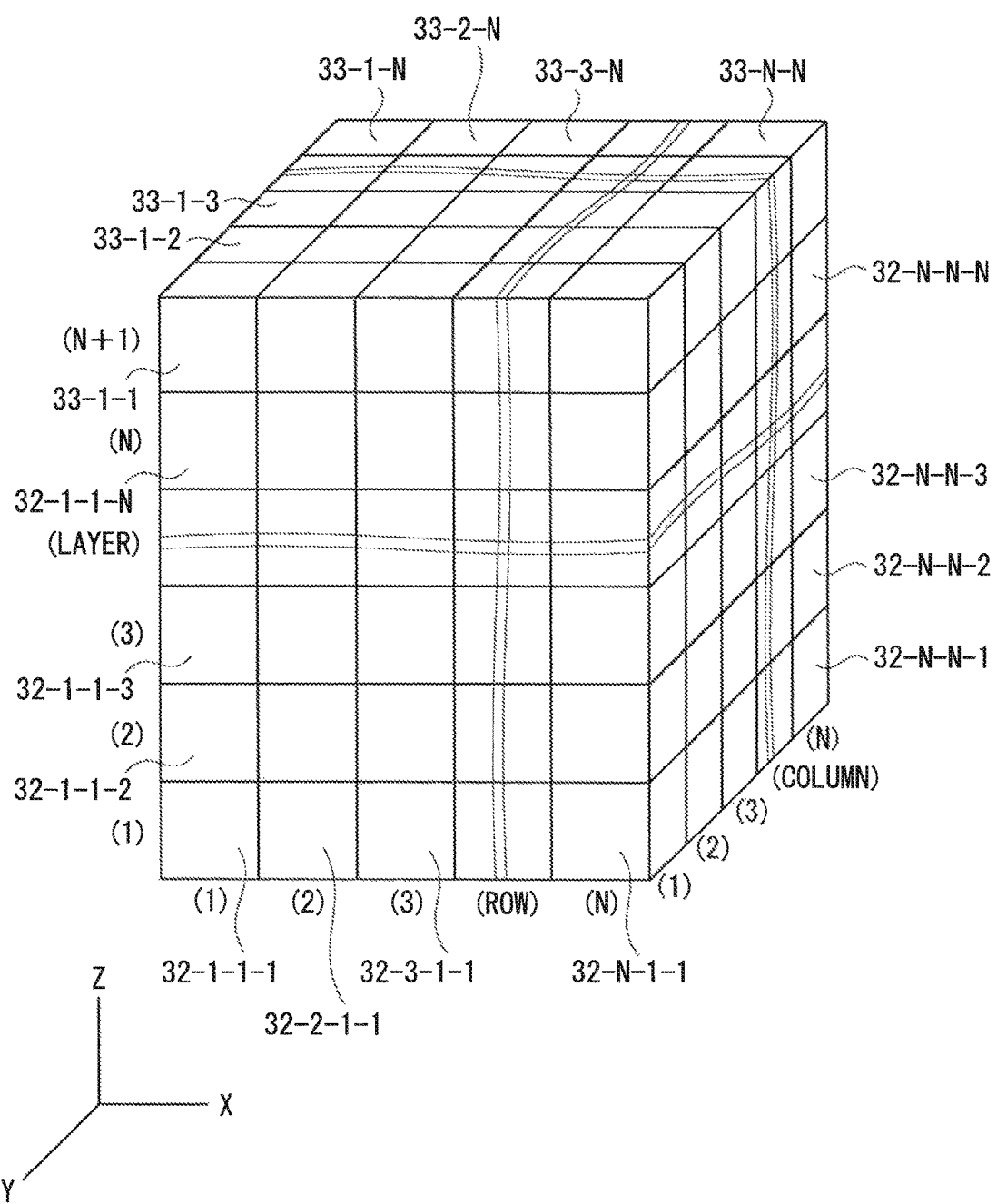
FIG. 4 is a configuration diagram illustrating an example of a storage unit having a memory unit and a redundant unit in the memory.

FIG. 4 is a configuration diagram illustrating an example of a storage unit having the memory units 32 and the redundant units 33 in the memory 3. In FIG. 4, the memory units 32-1-1-1 to 32-N-N-1 are arranged in a first layer, the memory units 32-1-1-2 to 32-N-N-2 are arranged in a second layer, and the memory units 32-1-1-3 to 32-N-N-3 are arranged in a third layer. In FIG. 4, the memory units 32-1-1-N to 32-N-N-N are arranged in an n-th layer. In FIG. 4, a fourth layer to an (n−1)-th layer are omitted. In FIG. 4, the redundant units 33-1-1 to 33-N-N are arranged in an (n+1)-th layer. Each of the memory units 32-1-1-1 to 32-N-N-N may be one DRAM chip. Each of the redundant units 33-1-1 to 33-N-N may be one DRAM chip. Further, one DRAM chip may be disposed in each layer of the first layer to the (n+1)-th layer. For example, one DRAM chip may have the memory units 32-1-1-1 to 32-N-N-1. In this way, in the storage unit of the memory 3, a plurality of memory units 32 and a plurality of redundant units 33 are arranged in a planar direction of the DRAM chip.

As illustrated in FIG. 2, the control device 31 has a control unit 311, a communication unit (wireless unit) 312, a holding unit 313, a managing unit 314 and a check unit 315. The control unit 311 of the control device 31 reads or deletes data of the memory unit 32 or writes (accesses) data in the memory unit 32 according to an instruction from the chipset 22.

The memory unit 32-1-1-1 has a memory block unit 321-1-1-1, a redundant block unit 322-1-1-1, a receiving unit (wireless unit) 323-1-1-1 and a holding unit 324-1-1-1. Likewise, the memory units 32-1-1-2 to 32-N-N-N have memory block units 321-1-1-2 to 321-N-N-N and redundant block units 322-1-1-2 to 322-N-N-N. Likewise, the memory units 32-1-1-2 to 32-N-N-N have receiving units 323-1-1-2 to 323-N-N-N and holding units 324-1-1-2 to 324-N-N-N.

In the following description, all of the memory block units 321-1-1-1 to 321-N-N-N may be described as the memory block units 321. One of the memory block units 321-1-1-1 to 321-N-N-N may be described as the memory block unit 321. The memory block unit 321 which has a plurality of memory cells, is a storage area in which data is written, read or deleted when the control unit 311 accesses the memory unit 32. The memory block unit 321 is an example of a "memory block". All of the redundant block units 322-1-1-1 to 322-N-N-N may be described as the redundant block units 322. One of the redundant block units 322-1-1-1 to 322-N-N-N may be described as the redundant block unit 322. The redundant block unit 322 is a storage area to be substituted for the memory block unit 321 of the memory unit 32, at which a defect has occurred. The redundant block unit 322 is an example of a "redundant block". All of the receiving units 323-1-1-1 to 323-N-N-N may be described as the receiving unit 323. One of the receiving units 323-1-1-1 to 323-N-N-N may be described as the receiving unit 323. Each of the receiving units 323-1-1-1 to 323-N-N-N may be described as each receiving unit 323. All of the holding units 324-1-1-1 to 324-N-N-N may be described as the holding units 324. One of the holding units 324-1-1-1 to 324-N-N-N may be described as the holding unit 324. Each of the holding units 324-1-1-1 to 324-N-N-N may be described as each holding unit 324. The redundant unit 33-1-1 has a receiving unit (wireless unit) 331-1-1, a redundant block unit 332-1-1 and a holding unit 333-1-1. Likewise, the redundant units 33-1-2 to 33-N-N have receiving units 331-1-2 to 331-N-N, redundant block units 332-1-1 to 332-N-N and holding units 333-1-1 to 333-N-N.

In the following description, all of the receiving units 331-1-1 to 331-N-N may be described as the receiving units 331. One of the receiving units 331-1-1 to 331-N-N may be described as the receiving unit 331. Each of the receiving units 331-1-1 to 331-N-N may be described as each receiving unit 331. All of the redundant block units 332-1-1 to 332-N-N may be described as the redundant block units 332. One of the redundant block units 332-1-1 to 332-N-N may be described as the redundant block unit 332. The redundant block unit 332 is an example of a "redundant block". Each of the redundant block units 332-1-1 to 332-N-N may be described as each redundant block unit 332. All of the holding units 333-1-1 to 333-N-N may be described as the holding units 333. One of the holding units 333-1-1 to 333-N-N may be described as the holding unit 333. Each of the holding units 333-1-1 to 333-N-N may be described as each holding unit 333.

The memory units 32 and the redundant units 33 are grouped into a plurality of groups. A plurality of memory units 32 and one redundant unit 33 in a direction in which the DRAM chips are stacked (in a Z direction in FIG. 4) are grouped into one group. That is, the plurality of memory units 32 and one redundant unit 33 arranged (stacked) in a direction in which the DRAM chips are stacked are grouped into one group. For example, in FIG. 4, the memory units 32-1-1-1 to 32-1-1-N and the redundant unit 33-1-1 form one group, and the memory units 32-N-N-1 to 32-N-N-N and the redundant unit 33-N-N form one group. Therefore, a plurality of groups each including the plurality of memory units 32 and one redundant unit 33 arranged in the direction in which the DRAM chips are stacked are arranged in a planar direction of the DRAM chip. The planar direction of the DRAM chip is, for example, a column direction (an X direction in FIG. 4) and a row direction (a Y direction in FIG. 4). The plurality of memory units 32 and one redundant unit 33 arranged in the direction in which the DRAM chips are stacked are connected through wired connection such as a TSV (Through Silicon Via). The TSV forms holes at the stacked chips and fills the holes with a metal, so that the chips are electrically connected to each other through the metal filling the holes.

Figure 5:
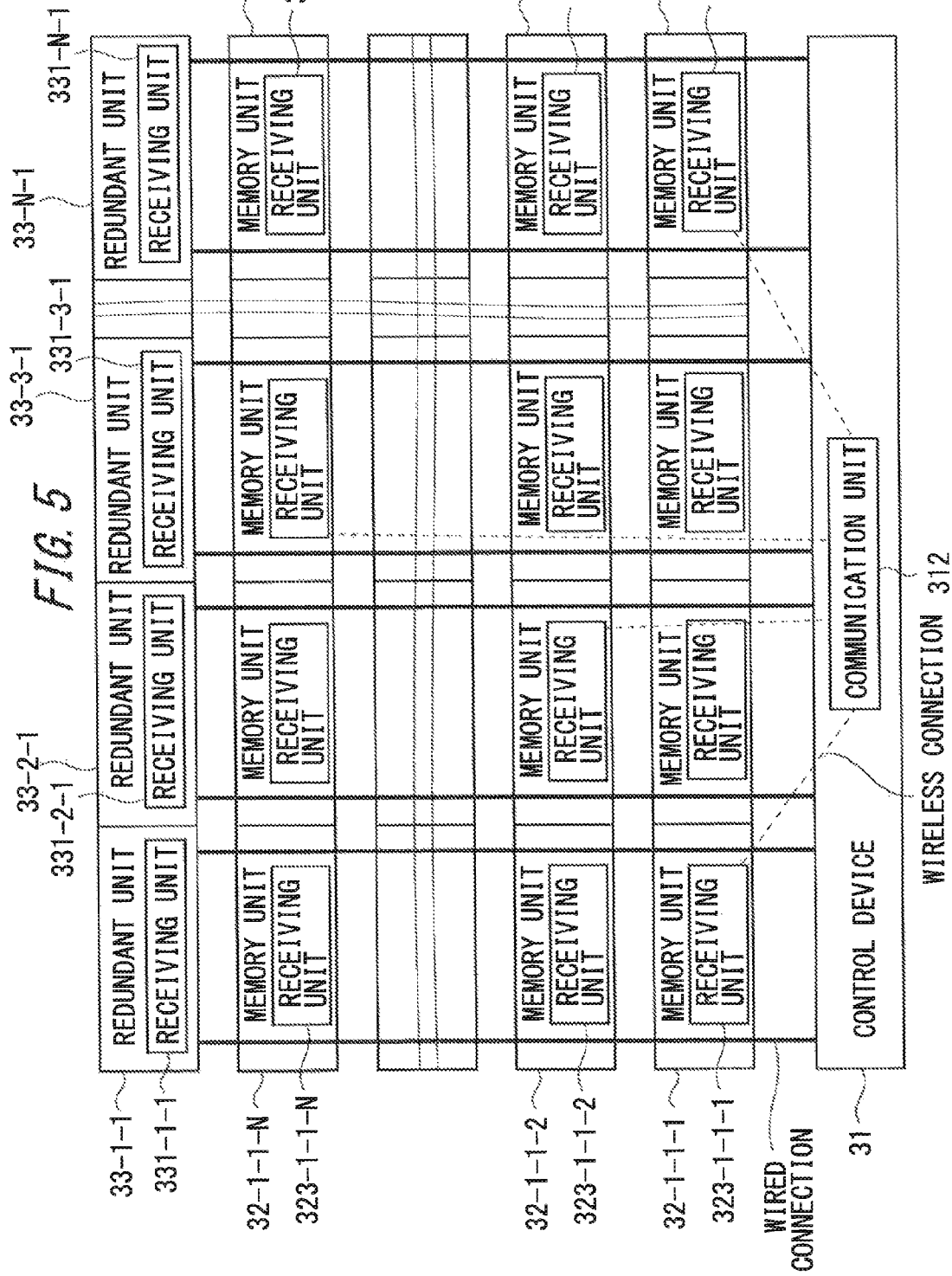
FIG. 5 illustrates connection between a control unit and the memory unit and connection between the control unit and the redundant unit.

FIG. 5 illustrates connection between the control device 31 and the memory units 32 and connection between the control device 31 and the redundant units 33. The control device 31 is connected to the memory units 32 through wired connection and wireless connection. In FIG. 5, the wired connection is indicated with thick solid lines, while the wireless connection is indicated with dotted lines.

For example, the control device 31 is connected to the memory unit 32 through wired connection such as a TSV. The control device 31 transmits an AD (address) signal, a BA (bank address) signal, a DQ (data) signal, and the like to the memory unit 32 through the wired connection. The memory unit 32 transmits the DQ signal to the control device 31 through the wired connection. The communication unit 312 of the control device 31 transmits a CS (chip select) signal to the receiving unit 323 of the memory unit 32 through the wireless connection. The CS signal is a control signal for accessing the memory unit 32.

For example, the control device 31 is connected to the redundant unit 33 via wired connection such as a TSV. The control device 31 transmits an AD signal, a BA signal, a DQ signal, and the like to the redundant unit 33 through the wired connection. The redundant unit 33 transmits a DQ signal to the control device 31 through the wired connection. The communication unit 312 of the control device 31 transmits a CS signal to the receiving unit 331 of the redundant unit 33 through wireless connection. The CS signal is a control signal for accessing the redundant unit 33.

A configuration table in which configurations of the memory units 32 are recorded (registered) is stored in the holding unit 313 of the control device 31. In the configuration table, a name of each memory unit 32 and an ID of each memory unit 32 are recorded in association with each other. Further, in the configuration table, a name of each redundant unit 33 and an ID of each redundant unit 33 are recorded in association with each other. FIG. 6 illustrates an example of the configuration table.

The name of each memory unit 32 is recorded in a field of "NAME OF MEMORY UNIT" in the configuration table of FIG. 6, and the ID of each memory unit 32 is recorded in a field of "ID OF MEMORY UNIT". In item 1 of the configuration table of FIG. 6, "MEMORY UNIT 32-1-1-1" is recorded in the field of "NAME OF MEMORY UNIT", and "MEM XXXXX111" is recorded in the field of "ID OF MEMORY UNIT". In item 2 of the configuration table of FIG. 6, "MEMORY UNIT 32-1-1-2" is recorded in the field of "NAME OF MEMORY UNIT", and "MEM XXXXX112" is recorded in the field of "ID OF MEMORY UNIT". In item n of the configuration table of FIG. 6, "MEMORY UNIT 32-1-1-N" is recorded in the field of "NAME OF MEMORY UNIT", and "MEM XXXXX11N" is recorded in the field of "ID OF MEMORY UNIT".

The name of each redundant unit 33 is recoded in a field of "NAME OF REDUNDANT UNIT" of the configuration table of FIG. 6, and the ID of each redundant unit 33 is recorded in a field of "ID OF REDUNDANT UNIT". In item 1001 of the configuration table of FIG. 6, "REDUNDANT UNIT 33-1-1" is recorded in the field of "NAME OF REDUNDANT UNIT", and "EXPAND XXXXXX11" is recorded in the field of "ID OF REDUNDANT UNIT". In item 1002 of the configuration table of FIG. 6, "REDUNDANT UNIT 33-1-2" is recorded in the field of "NAME OF REDUNDANT UNIT", and "EXPAND XXXXXX12" is recorded in the field of "ID OF REDUNDANT UNIT". In item 100n of the configuration table of FIG. 6, "REDUNDANT UNIT 33-1-N" is recorded in the field of "NAME OF REDUNDANT UNIT", and "EXPAND XXXXX1N" is recorded in the field of "ID OF REDUNDANT UNIT".

The check unit 315 of the control device 31 detects a defect (an error) in the memory unit 32. That is, the check unit 315 of the control device 31 detects whether or not a defect has occurred at the memory block unit 321 of the memory unit 32. The check unit 315 is an example of a "detecting unit".

When a defect has occurred at the memory unit 32, the managing unit 314 of the control device 31 creates or updates a management table in order to change an access destination of the memory unit 32. The control unit 311 of the control device 31 changes the access destination from the memory unit 32 at which the defect has occurred to the memory unit 32 or the redundant unit 33 having free capacity (available capacity) based on the management table.

<Initial Setting Processing (1)>

Figure 7:
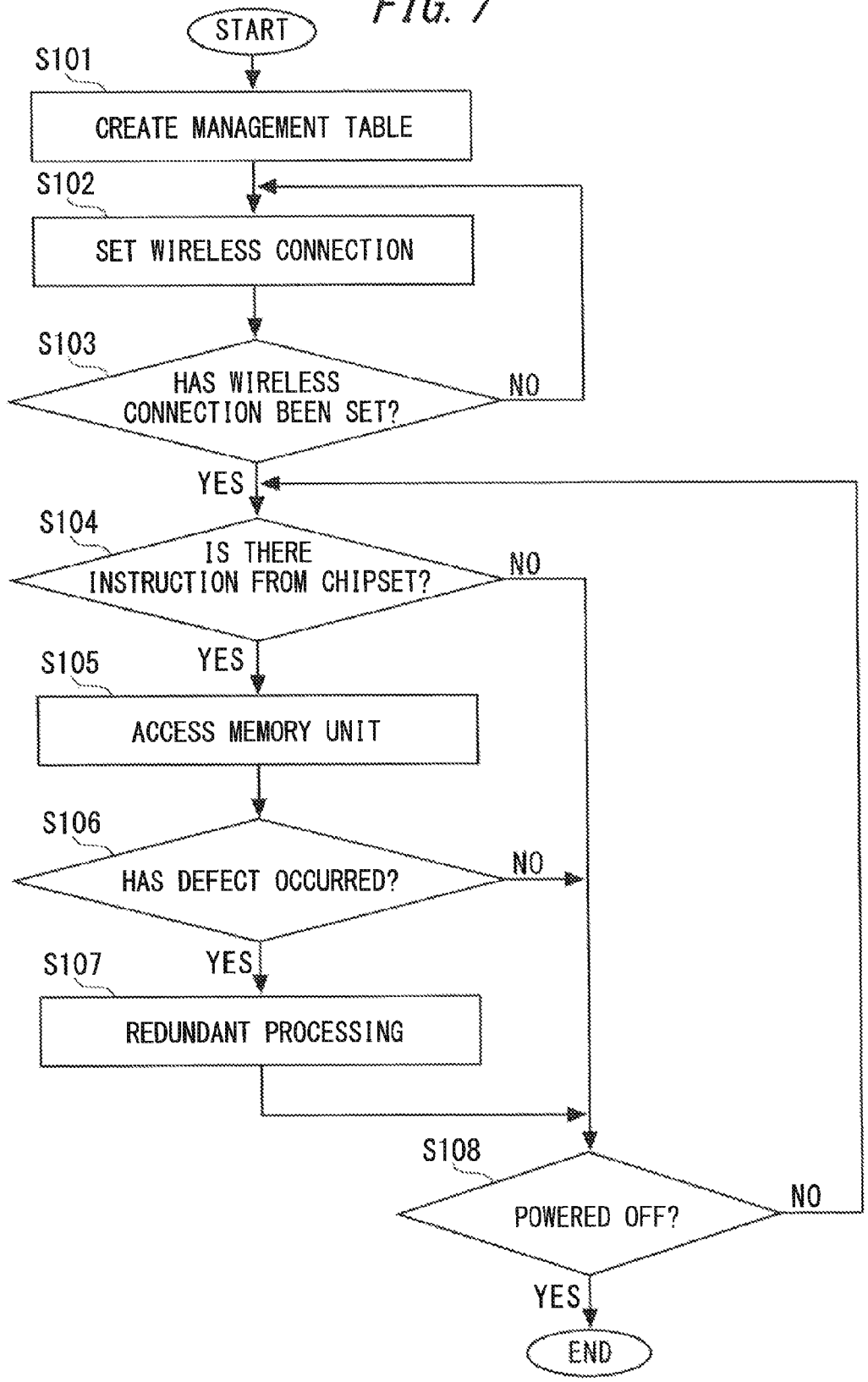
FIG. 7 is a flowchart illustrating initial setting processing (1)

Initial setting processing (1) will be described with reference to FIG. 7. FIG. 7 is a flowchart illustrating the initial setting processing (1). The flow of the initial setting processing (1) illustrated in FIG. 7 starts when the information processing device 1 is powered on. For example, the flow of the initial setting processing (1) illustrated in FIG. 7 is performed upon activation of the information processing device 1 or upon activation of the memory 3.

The managing unit 314 creates a management table for managing an access destination of the memory unit 32 based on the configuration table and a basic configuration diagram of the memory 3 (S101). For example, the basic configuration diagram of the memory 3 may be the configuration diagram illustrated in FIG. 4. The created management table is stored in the holding unit 313.

The managing unit 314 groups a plurality of memory units 32 and one redundant unit 33 in a direction in which DRAM chips are stacked into one group, and manages the memory units 32 and the redundant units 33 using the management table. The managing unit 314 manages the plurality of memory units 32 and one redundant unit 33 arranged in a planar direction of the DRAM chips, for each group. In the management table, the memory units 32 are grouped into a plurality of groups, and a name of each memory unit 32 and an ID of each memory unit 32 are recorded in association with each other. Further, in the management table, the redundant units 33 are grouped into a plurality of groups, and a name of each redundant unit 33 is recorded.

There is a case where a defect has occurred at the memory block unit 321 of the memory unit 32 and the redundant block unit 322 of the memory unit 32 is used in place of the memory block unit 321 of the memory unit 32. In this case, in the management table, a state of use of the redundant block unit 322 of the memory unit 32 is recorded. There is another case where a defect has occurred at the memory block unit 321 of the memory unit 32 and the redundant block unit 332 of the redundant unit 33 is used in place of the memory block unit 321 of the memory unit 32. In this case, in the management table, a state of use of the redundant unit 33 and an ID of the redundant unit 33 are recorded.

FIG. 8 illustrates an example of the management table. The name of each memory unit 32 is recorded in a field of "NAME OF MEMORY UNIT" of the management table of FIG. 8, and the ID of each memory unit 32 is recorded in a field of "ID OF MEMORY UNIT". The name of each redundant unit 33 is recorded in a field of "NAME OF REDUNDANT UNIT" of the management table of FIG. 8, and the number of the group is recorded in a field of "G" of the management table of FIG. 8. When each memory unit 32 and each redundant unit 33 have the same number of the group recorded in the field of "G" of the management table of FIG. 8, each memory unit 32 and each redundant unit 33 assigned with the same number belong to the same group.

In item 111 of the management table of FIG. 8, "MEMORY UNIT 32-1-1-1" is recorded in a field of "NAME OF MEMORY UNIT", "MEM XXXXX111" is recorded in a field of "ID OF MEMORY UNIT", and "1" is recorded in a field of "G". In item 112 of the management table of FIG. 8, "MEMORY UNIT 32-1-1-2" is recorded in a field of "NAME OF MEMORY UNIT", "MEM XXXXX112" is recorded in a field of "ID OF MEMORY UNIT", and "1" is recoded in a field of "G". In item 11N of the management table of FIG. 8, "MEMORY UNIT 32-1-1-N" is recorded in a field of "NAME OF MEMORY UNIT", "MEM XXXXX11N" is recorded in a field of "ID OF MEMORY UNIT", and "1" is recorded in a field of "G". In item 11N1 of the management table of FIG. 8, "REDUNDANT UNIT 33-1-1" is recorded in a field of "NAME OF REDUNDANT UNIT", and "1" is recoded in a field of "G".

The communication unit 312 sets wireless connection with the receiving units 323 of the memory units 32 according to the management table (S102). That is, the communication unit 312 establishes negotiation with the receiving units 323 of the memory units 32. As a result of the wireless connection being set between the communication unit 312 and the receiving units 323 of the memory units 32, wireless communication between the communication unit 312 and the receiving units 323 of the memory units 32 becomes possible.

The managing unit 314 determines whether wireless connection is set between the communication unit 312 and the receiving units 323 of the memory units 32 (S103). When the wireless connection is set between the communication unit 312 and the receiving unit 323 of the memory unit 32 (S103; Yes), the processing proceeds to step S104. Meanwhile, when the wireless connection is not set between the communication unit 312 and the receiving unit 323 of the memory unit 32 (S103; No), the processing returns to step S102.

The control unit 311 determines whether or not there is any instruction from the chipset 22 (S104). The instruction from the chipset 22 is, for example, an instruction to access the memory unit 32 such as an instruction to read or delete data of the memory unit 32 or an instruction to write data in the memory unit 32.

When there is an instruction from the chipset 22 (S104; Yes), the processing proceeds to step S105. Meanwhile, when there is no instruction from the chipset 22 (S104; No), the processing proceeds to step S108.

The control unit 311 accesses the memory unit 32 according to the instruction from the chipset 22 (S105). That is, the control unit 311 reads or deletes data of the memory block unit 321 of the memory unit 32 or writes data in the memory unit 32, or the like, according to the instruction from the chipset 22. Hereinafter, the memory unit 32 which is a target of access will be referred to as a target memory unit 32.

The managing unit 314 extracts the ID of the receiving unit 323 of the target memory unit 32 from the management table and transmits the extracted ID to the communication unit 312. The communication unit 312 receives the ID of the receiving unit 323 of the target memory unit 32 from the managing unit 314. The communication unit 312 transmits the ID of the receiving unit 323 of the target memory unit 32 as a CS signal to the memory unit 32 through wireless connection. The control unit 311 transmits an AD signal, a BA signal, a DQ signal, and the like, to the memory unit 32 through wired connection.

The receiving unit 323 of the memory unit 32 receives the CS signal. The receiving unit 323 of the memory unit 32 determines whether the ID stored in the holding unit 324 of the memory unit 32 matches the ID received as the CS signal. Because the ID stored in the holding unit 324 of the target memory unit 32 matches the ID received as the CS signal, the target memory unit 32 receives the AD signal, the BA signal, the DQ signal, and the like. Meanwhile, since the IDs stored in the holding units 324 of the memory units 32 other than the target memory unit 32 do not match the ID received as the CS signal, the memory units 32 other than the target memory unit 32 do not receive the AD signal, the BA signal, the DQ signal, and the like.

After the processing at S105 is finished, the processing proceeds to step S106, where the check unit 315 checks whether or not a defect (an error) has occurred at the memory block unit 321 of the target memory unit 32 (S106). The defect is, for example, a correctable error (CE) for which data can be restored, or an uncorrectable error (UE) for which data restoration is not possible.

When a defect has occurred at the memory block unit 321 of the target memory unit 32 (S106; Yes), redundant processing is performed (S107). The redundant processing will be described later. Meanwhile, when a defect has not occurred at the memory block unit 321 of the target memory unit 32 (S106; No), the processing proceeds to S108.

The control unit 311 determines whether or not the information processing device 1 has been powered off (S108). When the information processing device 1 has been powered off (S108; Yes), the flow of the initial setting processing (1) illustrated in FIG. 7 is finished. Meanwhile, when the information processing device 1 has not been powered off (S108; No), the processing returns to step S104. The processing may return to step S101 or S103 when the result of determination in step S108 is No.

<Redundant Processing (1)>

Figure 9:
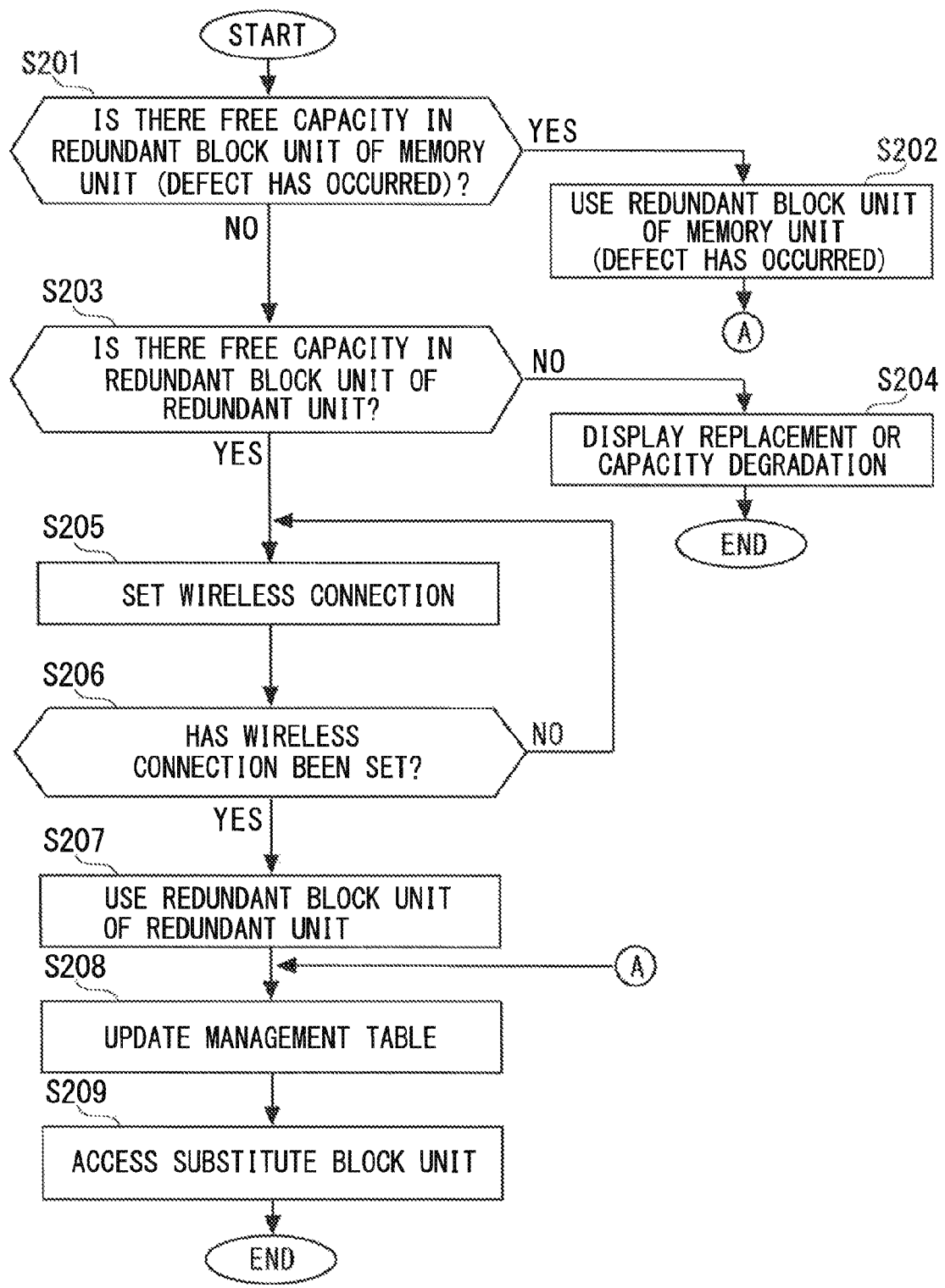
FIG. 9 is a flowchart illustrating redundant processing (1)

The redundant processing (1) will be described with reference to FIG. 9. FIG. 9 is a flowchart of the redundant processing (1).

The control unit 311 checks free capacity of the redundant block unit 322 of the memory unit 32 having the memory block unit 321 at which a defect has occurred. The control unit 311 determines (judges) whether or not there is free capacity in the redundant block unit 322 of the memory unit 32 having the memory block unit 321 at which a defect has occurred (S201). The control unit 311 is an example of a "checking unit". Hereinafter, the memory unit 32 having the memory block unit 321 at which a defect has occurred will be described as a memory unit 32 (where a defect has occurred). For example, the control unit 311 may determine whether or not there is free capacity in the redundant block unit 322 of the memory unit 32 (where a defect has occurred) according to whether or not free capacity of the redundant block unit 322 of the memory unit 32 (where a defect has occurred) is greater than a predetermined value.

When there is free capacity in the redundant block unit 322 of the memory unit 32 (where a defect has occurred) (S201; Yes), the processing proceeds to step S202. The control unit 311 determines to use the redundant block unit 322 of the memory unit 32 (where a defect has occurred) in place of a portion where a defect has occurred, of the memory block unit 321 of the memory unit 32 (where a defect has occurred) (S202). That is, the control unit 311 determines the redundant block unit 322 having free capacity in the memory unit 32 (where a defect has occurred) as a substitute block unit which is substituted for the memory block unit 321 of the memory unit 32 (where a defect has occurred). After the processing of step S202 is performed, the processing proceeds to step S208.

When there is no free capacity in the redundant block unit 322 of the memory unit 32 (where a defect has occurred) (S201; No), the processing proceeds to step S203. The control unit 311 checks free capacity of the redundant block units 332 of the redundant units 33 and determines (judges) whether or not there is free capacity in at least one of the redundant block units 332 of the redundant units 33 (S203). For example, the control unit 311 may determine whether or not there is free capacity in the redundant block units 332 of the redundant units 33 according to whether or not free capacity of the redundant block unit 332 of the redundant unit 33 is greater than a predetermined value. The redundant unit 33 which becomes a target of determination (judgment) includes the redundant unit 33 in the same group (own group) as the group of the memory unit 32 (where a defect has occurred) and the redundant unit 33 in a different group (other group) from the group of the memory unit 32 (where a defect has occurred).

Note that in the flow of the redundant processing (1) illustrated in FIG. 9, the processing of step S201 and S202 may be omitted. That is, the flow of the redundant processing (1) illustrated in FIG. 9 may start from the processing at step S203.

When there is no free capacity in at least one of the redundant block units 332 of the redundant units 33, that is, none of the redundant block units 332 of the redundant units 33 has free capacity (S203; No), the processing proceeds to step S204.

The control unit 311 transmits a signal indicating that there is no free capacity in the redundant block units 332 of the redundant units 33 to the processing device 2. The processing device 2 makes the display device 5 display replacement of the memory 3 or capacity degradation of the memory 3 (defect notification) (S204). After the processing of step S204 is performed, the flow of the redundant processing (1) illustrated in FIG. 9 is finished.

When there is free capacity in at least one of the redundant block units 332 of the redundant units 33 (S203; Yes), the processing proceeds to step S205. The communication unit 312 sets wireless connection with the receiving unit 331 of the redundant unit 33 according to the management table (S205). That is, the communication unit 312 establishes negotiation with the receiving unit 331 of the redundant unit 33. The wireless connection set between the communication unit 312 and the receiving unit 331 of the redundant unit 33 enables wireless communication between the communication unit 312 and the receiving unit 331 of the redundant unit 33.

The managing unit 314 determines whether wireless connection is set between the communication unit 312 and the receiving unit 331 of the redundant unit 33 (S206). When wireless connection between the communication unit 312 and the receiving unit 331 of the redundant unit 33 is not set (S206; No), the processing returns to step S205.

When wireless connection is set between the communication unit 312 and the receiving unit 331 of the redundant unit 33 (S206; Yes), the processing proceeds to step S207. The control unit 311 determines to use the redundant block unit 332 of the redundant unit 33 in place of a portion where a defect has occurred, of the memory block unit 321 of the memory unit 32 (where a defect has occurred) (S207). That is, the control unit 311 determines the redundant block unit 332 having free capacity in the redundant unit 33 as a substitute block unit which is substituted for the memory block unit 321 of the memory unit (where a defect has occurred). When there is a plurality of redundant block units 332 having free capacity, the control unit 311 selects any one of the plurality of redundant block units 332. The control unit 311 is an example of a "determining unit".

The substitute block unit is determined from the redundant block units 332 of the redundant units 33 in the same group (own group) as the group of the memory unit 32 (where a defect has occurred) and the redundant block units 332 of the redundant units 33 in a different group (other group) from the group of the memory unit 32 (where a defect has occurred).

The managing unit 314 updates the management table (S208). In the processing of step S202, when the control unit 311 determines to use the redundant block unit 322 of the memory unit 32 (where a defect has occurred), the managing unit 314 performs the following updating processing (1A). In the processing of step S207, when the control unit 311 determines to use the redundant block unit 332 of the redundant unit 33, the managing unit 314 performs the following updating processing (1B).

<Updating Processing (1A)>

The managing unit 314 records information indicating a state of use of the redundant block unit 322 of the memory unit 32 (where a defect has occurred) in the management table. The redundant block unit 322 of the memory unit 32 (where a defect has occurred) is used. Therefore, the managing unit 314 records "IN USE" in the management table as the information indicating the state of use of the redundant block unit 322 of the memory unit 32 (where a defect has occurred).

FIG. 10 illustrates an example of the updating processing of the management table. FIG. 10 illustrates the updating processing in a case where a defect has occurred at the memory block unit 321-1-1-1 of the memory unit 32-1-1-1 and the redundant block unit 322-1-1-1 of the memory unit 32-1-1-1 is used. Because the redundant block unit 322-1-1-1 of the memory unit 32-1-1-1 is used, "IN USE" is recorded in a field of "STATE OF USE OF REDUNDANT BLOCK UNIT" in item 111 of the management table of FIG. 10.

<Updating Processing (1B)>

The managing unit 314 records information indicating a state of use of the redundant block unit 322 of the memory unit 32 (where a defect has occurred), information indicating a state of use of the redundant unit 33 and an ID of the redundant unit 33 in the management table. There is no free capacity in the redundant block unit 322 of the memory unit (where a defect has occurred). Therefore, the managing unit 314 records "NO FREE CAPACITY" in the management table as the information indicating the state of use of the redundant block unit 322 of the memory unit 32 (where a defect has occurred). The redundant block unit 332 of the redundant unit 33 is used. Therefore, the managing unit 314 records "NAME OF REDUNDANT UNIT 33" in the management table as the information indicating the state of use of the redundant unit 33.

FIG. 11 illustrates an example of the updating processing of the management table. FIG. 11 illustrates the updating processing in a case where a defect has occurred at the memory block unit 321-1-1-1 of the memory unit 32-1-1-1 and the redundant block unit 332-1-1 of the redundant unit 33-1-1 is used.

Because there is no free capacity in the redundant block unit 322-1-1-1 of the memory unit 32-1-1-1, "NO FREE CAPACITY" is recorded in a field of "STATE OF USE OF REDUNDANT BLOCK UNIT" in item 111 of the management table of FIG. 11. Because the redundant block unit 332-1-1 of the redundant unit 33-1-1 is used, "REDUNDANT UNIT 33-1-1" is recorded in a field of "STATE OF USE OF REDUNDANT UNIT" in item 111 of the management table of FIG. 11, and "EXPAND XXXXXX11" is recorded in a field of "ID OF REDUNDANT UNIT". In this manner, the name and the ID of the redundant unit 33 having the redundant block unit 332 which is used as the substitute block unit are recorded in the management table.

The control unit 311 accesses the substitute block unit determined in step S202 or S207 based on the updated management table (S209). After that, when there is an instruction to access the memory unit 32 (where a defect has occurred) from the chipset 22, the control unit 311 accesses the substitute block unit determined in the processing of step S202 or S207 based on the updated management table. In this manner, the control unit 311 accesses the memory unit 32 with reference to the management table which defines a correspondence relationship between the memory block unit 321 of the memory unit 32 (where a defect has occurred) and the substitute block unit. Note that the redundant unit 33 is accessed through processing similar to processing performed when the target memory unit 32 is accessed in step S105 of FIG. 7. After the processing of step S209 is performed, the flow of the redundant processing (1) illustrated in FIG. 9 is finished.

Figure 12:
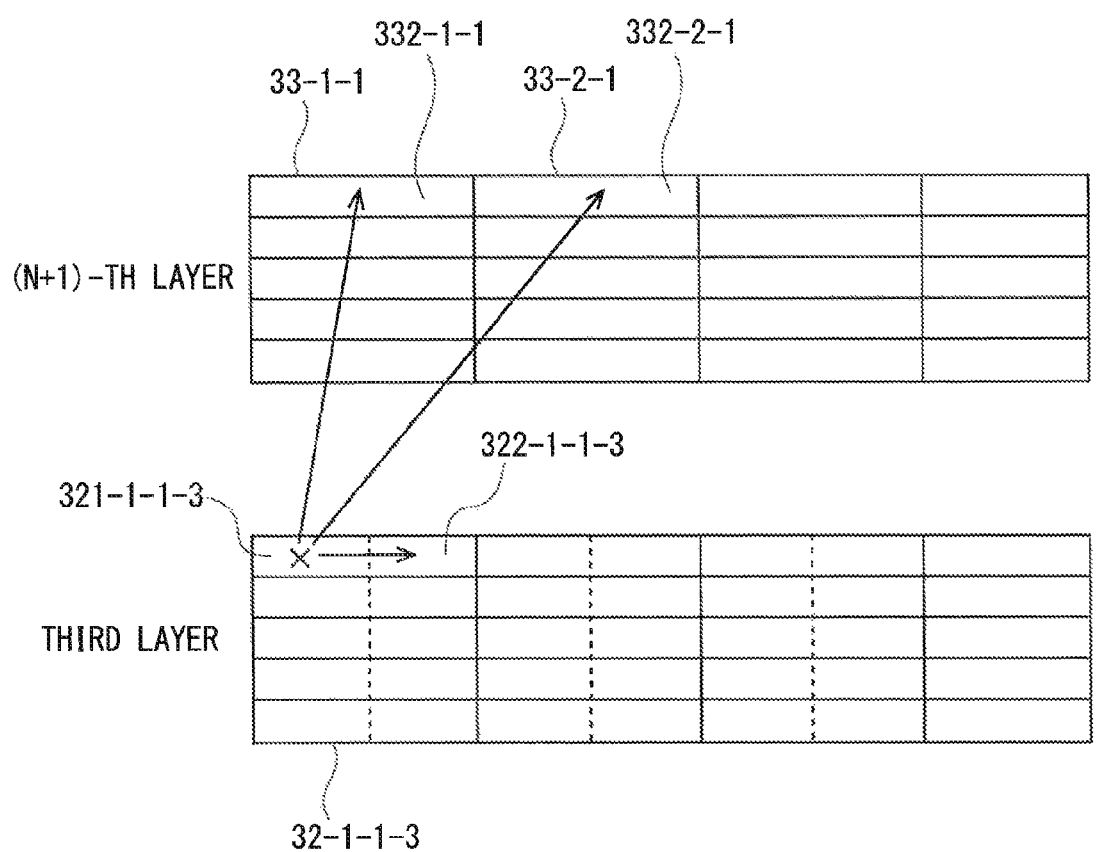
FIG. 12 illustrates an example of redundant processing (1)

For example, as illustrated in FIG. 12, when a defect has occurred at the memory block unit 321-1-1-3 of the memory unit 32-1-1-3 in the third layer, it is determined whether or not there is free capacity in the redundant block unit 322-1-1-3 of the memory unit 32-1-1-3. For example, when there is free capacity in the redundant block unit 322-1-1-3 of the memory unit 32-1-1-3, the redundant block unit 322-1-1-3 of the memory unit 32-1-1-3 is used.

According to the redundant processing (1), the redundant block unit 322 of the memory unit 32 (where a defect has occurred) can be used as a substitute block unit which is substituted for the memory block unit 321 of the memory unit 32 (where a defect has occurred).

When there is no free capacity in the redundant block unit 322-1-1-3 of the memory unit 32-1-1-3, it is checked whether there is free capacity in the redundant block units 332 of the redundant units 33. For example, when there is free capacity in the redundant block unit 332-1-1 of the redundant unit 33-1-1 in the (n+1)-th layer, the redundant block unit 332-1-1 of the redundant unit 33-1-1 is used. Therefore, the redundant block unit 332-1-1 of the redundant unit 33-1-1 in the same group as the memory unit 32-1-1-3 having the memory block unit 321-1-1-3 where a defect has occurred is used. For example, if there is free capacity in the redundant block unit 332-2-1 of the redundant unit 33-2-1 in the (n+1)-th layer, the redundant block unit 332-2-1 of the redundant unit 33-2-1 is used. Therefore, the redundant block unit 332-2-1 of the redundant unit 33-2-1 in a different group from the memory unit 32-1-1-3 having the memory block unit 321-1-1-3 where a defect has occurred is used.

According to the redundant processing (1), the redundant block unit 332 of the redundant unit 33 in the group which is the same as or different from the group of the memory unit 32 (where a defect has occurred) can be used as the substitute block unit which is substituted for the memory block unit 321 of the memory unit 32 (where a defect has occurred).

According to the embodiments, because a CS signal is transmitted to the memory unit 32 and the redundant unit 33 through wireless connection, it is possible to easily access the memory unit 32 and the redundant unit 33. According to the embodiments, when a defect has occurred at the memory block unit 321 of the memory unit 32, it is possible to easily address occurrence of a defect in the memory block unit 321 of the memory unit 32, and thus improve continuation of the operation of the memory 3.

<Redundant Processing (2)>

Figure 13:
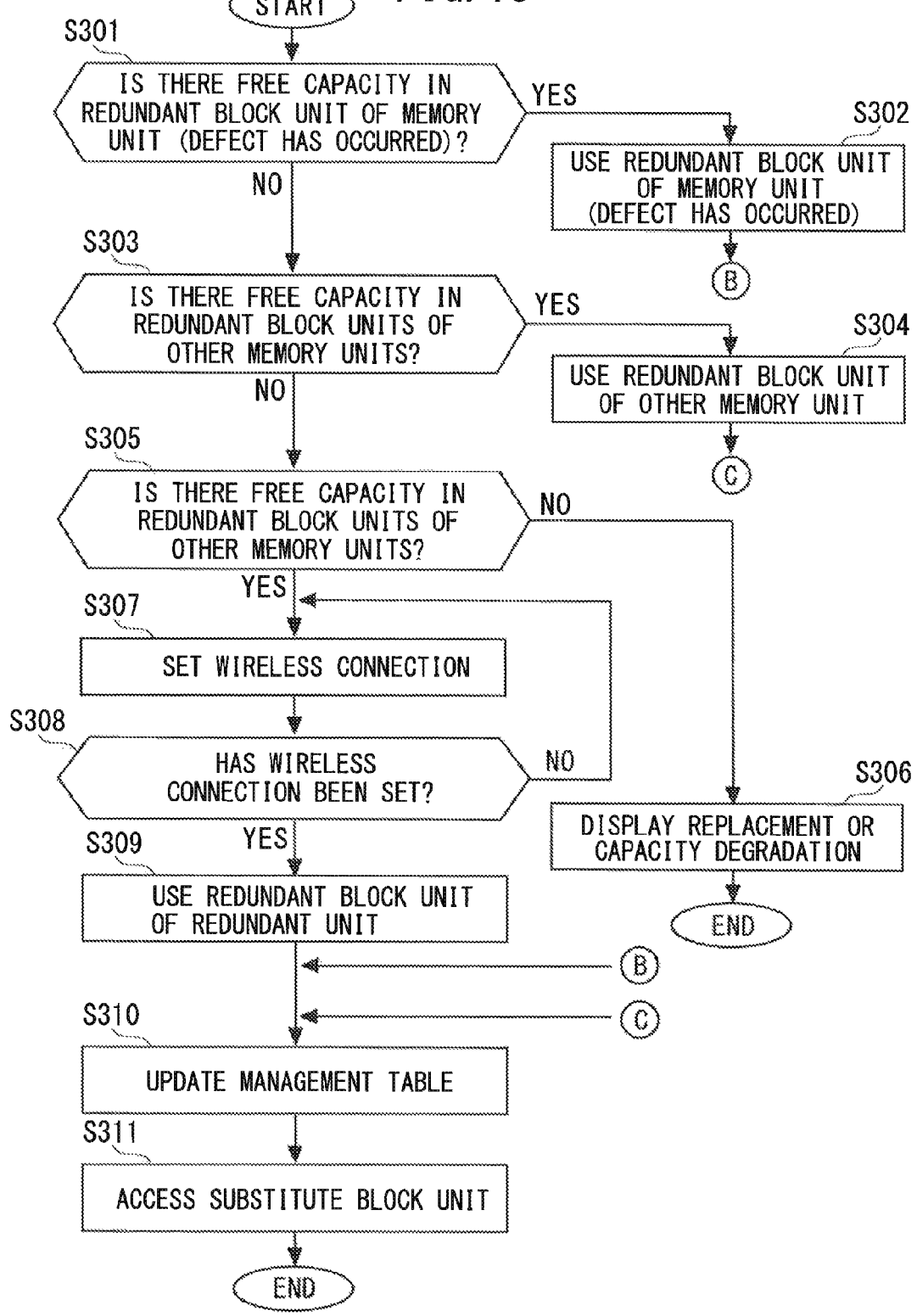
FIG. 13 is a flowchart illustrating redundant processing (2)

The redundant processing (2) will be described with reference to FIG. 13. FIG. 13 is a flowchart of the redundant processing (2).

The control unit 311 checks free capacity of the redundant block unit 322 of the memory unit 32 having the memory block unit 321 where a defect has occurred. The control unit 311 determines whether or not there is free capacity in the redundant block unit 322 of the memory unit 32 having the memory block unit 321 where a defect has occurred (S301). Hereinafter, the memory unit 32 having the memory block unit 321 at which a defect has occurred will be described as a memory unit 32 (where a defect has occurred). For example, the control unit 311 may determine whether there is free capacity in the redundant block unit 322 of the memory unit 32 (where a defect has occurred) according to whether or not free capacity of the redundant block unit 322 of the memory unit 32 (where a defect has occurred) is greater than a predetermined value.

When there is free capacity in the redundant block unit 322 of the memory unit 32 (where a defect has occurred) (S301; Yes), the processing proceeds to step S302. The control unit 311 determines to use the redundant block unit 322 of the memory unit 32 (where a defect has occurred) in place of a portion where a defect has occurred, of the memory block unit 321 of the memory unit 32 (where a defect has occurred) (S302). That is, the control unit 311 determines the redundant block unit 322 having free capacity in the memory unit 32 (where a defect has occurred) as a substitute block unit which is substituted for the memory block unit 321 of the memory unit 32 (where a defect has occurred). After the processing of step S302 is performed, the processing proceeds to step S310.

When there is no free capacity in the redundant block unit 322 of the memory unit 32 (where a defect has occurred) (S301; No), the processing proceeds to step S303. The control unit 311 checks free capacity in the redundant block units 322 of other memory units 32 and determines whether or not there is free capacity in at least one of the redundant block units 322 of the other memory units 32 (S303). The other memory units 32 are all the memory units 32 except the memory unit 32 (where a defect has occurred). The other memory units 32 include a plurality of memory units 32 in the same group (own group) as the group of the memory unit 32 (where a defect has occurred) and a plurality of memory units 32 in a different group (other group) from the group of the memory unit 32 (where a defect has occurred).

Note that in the flow of the redundant processing (2) illustrated in FIG. 13, the processing of step S301 and S302 may be omitted. That is, the flow of the redundant processing (2) illustrated in FIG. 13 may start from the processing at step S303.

When there is free capacity in at least one of the redundant block units 322 of the other memory units 32 (S303; Yes), the processing proceeds to step S304. The control unit 311 determines to use the redundant block unit 322 of the other memory unit 32 in place of a portion where a defect has occurred, of the memory block unit 321 of the memory unit 32 (where a defect has occurred) (S304). That is, the control unit 311 determines the redundant block unit 322 having free capacity in the other memory unit 32 as a substitute block unit which is substituted for the memory block unit 321 of the memory unit 32 (where a defect has occurred). When there are a plurality of redundant block units 322 having free capacity, the control unit 311 selects any one of the plurality of redundant block units 322. After the processing of step S304 is performed, the processing proceeds to step S310.

When there is no free capacity in at least one of the redundant block units 322 of the other memory units 32, that is, none of the redundant block units 322 of the other memory units 32 has free capacity (S303; No), the processing proceeds to step S305. The control unit 311 checks free capacity in the redundant block units 332 of the redundant units 33 and determines whether or not there is free capacity in at least one of the redundant block units 332 of the redundant units 33 (S305).

When there is no free capacity in at least one of the redundant block units 332 of the redundant units 33, that is, none of the redundant block units 332 of the redundant units 33 has free capacity (S305; No), the processing proceeds to step S306.

The control unit 311 transmits a signal indicating that there is no free capacity in the redundant block units 332 of the redundant units 33 to the processing device 2. The processing device 2 makes the display device 5 display replacement of the memory 3 or capacity degradation (defect notification) of the memory 3 (S306). After the processing of step S306 is performed, the flow of the redundant processing (2) illustrated in FIG. 13 is finished.

When there is free capacity in at least one of the redundant block units 332 of the redundant units 33 (S305; Yes), the processing proceeds to step S307. The communication unit 312 sets wireless connection with the receiving unit 331 of the redundant unit 33 (S307). That is, the communication unit 312 establishes negotiation with the receiving unit 331 of the redundant unit 33. The wireless connection set between the communication unit 312 and the receiving unit 331 of the redundant unit 33 enables wireless communication between the communication unit 312 and the receiving unit 331 of the redundant unit 33.

The managing unit 314 determines whether wireless connection is set between the communication unit 312 and the receiving unit 331 of the redundant unit 33 (S308). When wireless connection is not set between the communication unit 312 and the receiving unit 331 of the redundant unit 33 (S308; No), the processing returns to step S307.

When wireless connection is set between the communication unit 312 and the receiving unit 331 of the redundant unit 33 (S308; Yes), the processing proceeds to step S309. The control unit 311 determines to use the redundant block unit 332 of the redundant unit 33 in place of a portion where a defect has occurred, of the memory block unit 321 of the memory unit 32 (where a defect has occurred) (S309). That is, the control unit 311 determines the redundant block unit 332 having free capacity in the redundant unit 33 as a substitute block unit which is substituted for the memory block unit 321 of the memory unit (where a defect has occurred).

The substitute block unit is selected from the redundant block units 332 of the redundant units 33 in the same group (own group) as the group of the memory unit 32 (where a defect has occurred) and the redundant block units 332 of the redundant units 33 in a different group (other group) from the group of the memory unit 32 (where a defect has occurred). When there are a plurality of redundant block units 332 having free capacity, the control unit 311 selects any one of the plurality of redundant block units 332.

The managing unit 314 updates the management table (S310). When the control unit 311 determines to use the redundant block unit 322 of the memory unit 32 (where a defect has occurred) in the processing of step S302, the managing unit 314 performs the following updating processing (2A). When the control unit 311 determines to use the redundant block unit 322 of the other memory unit 32 in the processing of step S304, the managing unit 314 performs the following updating processing (2B). When the control unit 311 determines to use the redundant block unit 332 of the redundant unit 33 in the processing of step S309, the managing unit 314 performs the following updating processing (2C).

<Updating Processing (2A)>

The managing unit 314 records information indicating a state of use of the redundant block unit 322 of the memory unit 32 (where a defect has occurred) in the management table. Because the redundant block unit 322 of the memory unit 32 (where a defect has occurred) is used, the managing unit 314 records "IN USE" in the management table as the information indicating the state of use of the redundant block unit 322 of the memory unit 32 (where a defect has occurred).

<Updating Processing (2B)>

The managing unit 314 records information indicating a state of use of the redundant block unit 322 of the memory unit 32 in the management table. In this case, the information indicating the state of use of the redundant block unit 322 of the memory unit 32 (where a defect has occurred) and the information indicating the state of use of the redundant block unit 322 of the other memory unit 32 are recorded in the management table.

There is no free capacity in the redundant block unit 322 of the memory unit 32 (where a defect has occurred). Therefore, the managing unit 314 records "NO FREE CAPACITY" in the management table as the information indicating the state of use of the redundant block unit 322 of the memory unit 32 (where a defect has occurred).

There is free capacity in at least one of the redundant block units 322 of the other memory units 32. Therefore, the managing unit 314 records "FREE CAPACITY" or "NO FREE CAPACITY" in the management table as the information indicating the state of use of the redundant block units 322 of the memory units 32. For the state of use of the redundant block unit 322 having free capacity of the memory unit 32, "FREE CAPACITY" is recorded in the management table. For the redundant block unit 322 having no free capacity of the memory unit 32, "NO FREE CAPACITY" is recorded in the management table.

The redundant block unit 322 of the other memory unit 32 is used. Therefore, the managing unit 314 records the information indicating the state of use of the other memory unit 32 and an ID of the other memory unit 32 in the management table.

FIG. 14 illustrates an example of the updating processing of the management table. FIG. 14 illustrates the updating processing in a case where a defect has occurred at the memory block unit 321-1-1-1 of the memory unit 32-1-1-1 and the memory block unit 321-1-1-2 of the memory unit 32-1-1-2 is used.

Because there is no free capacity in the redundant block unit 322-1-1-1 of the memory unit 32-1-1-1, "NO FREE CAPACITY" is recorded in a field of "STATE OF USE OF REDUNDANT BLOCK UNIT" in item 111 of the management table of FIG. 14. In item 111 of the management table of FIG. 14, "MEMORY UNIT 32-1-1-2" is recorded in a field of "STATE OF USE OF OTHER MEMORY UNIT" and "EXPAND XXXXXX11" is recorded in a field of "ID OF OTHER MEMORY UNIT". In this manner, the name and the ID of the other memory unit 32 having the redundant block unit 322 used as the substitute block unit are recorded in the management table.

<Updating Processing (2C)>

The managing unit 314 records information indicating a state of use of the redundant block unit 322 of the memory unit 32 (where a defect has occurred), information indicating a state of use of the redundant unit 33 and an ID of the redundant unit 33 in the management table.

There is no free capacity in the redundant block unit 322 of the memory unit 32 (where a defect has occurred). Therefore, the managing unit 314 records "NO FREE CAPACITY" in the management table as the information indicating the state of use of the redundant block unit 322 of the memory unit 32 (where a defect has occurred). The redundant block unit 332 of the redundant unit 33 is used. Therefore, the managing unit 314 records "NAME OF REDUNDANT UNIT 33" in the management table as the information indicating the state of use of the redundant unit 33.

FIG. 15 illustrates an example of the updating processing of the management table. FIG. 15 illustrates the updating processing in a case where a defect has occurred at the memory block unit 321-1-1-1 of the memory unit 32-1-1-1 and the redundant block unit 332-1-1 of the redundant unit 33-1-1 is used.

Because there is no free capacity in the redundant block units 322-1-1-1 to 322-1-1-N of the memory units 32-1-1-1 to 32-1-1-N, "NO FREE CAPACITY" is recorded in a field of "STATE OF USE OF REDUNDANT BLOCK UNIT" in items 111 to 11N in the management table of FIG. 15. Because the redundant block unit 332-1-1 of the redundant unit 33-1-1 is used, "REDUNDANT UNIT 33-1-1" is recorded in the field of "STATE OF USE OF REDUNDANT UNIT" in item 111 of the management table of FIG. 15, and "EXPAND XXXXXX11" is recorded in a field of "ID OF REDUNDANT UNIT". In this manner, the name and the ID of the redundant unit 33 having the redundant block unit 332 used as a substitute block unit are recorded in the management table.

The memory block units 321-1-1-2 to 321-1-1-N of the memory units 32-1-1-2 to 32-1-1-N are not used. Therefore, nothing is recorded in the fields of "STATE OF USE OF OTHER MEMORY UNIT" and "MEMORY UNIT 32-1-1-2" in items 111 to 11N in the management table of FIG. 15.

The control unit 311 accesses the substitute block unit determined in the processing of steps S302, S304 or S309 based on the updated management table (S311). After that, when there is an instruction to access the memory unit 32 (where a defect has occurred) from the chipset 22, the control unit 311 access the substitute block unit determined in the processing of steps S302, S304 or S309 based on the updated management table. Note that the redundant unit 33 is accessed through the processing similar to the processing performed when the target memory unit 32 is accessed in step S105 of FIG. 7. After the processing of step S311 is performed, the flow of the redundant processing (2) illustrated in FIG. 13 is finished.

Figure 16:
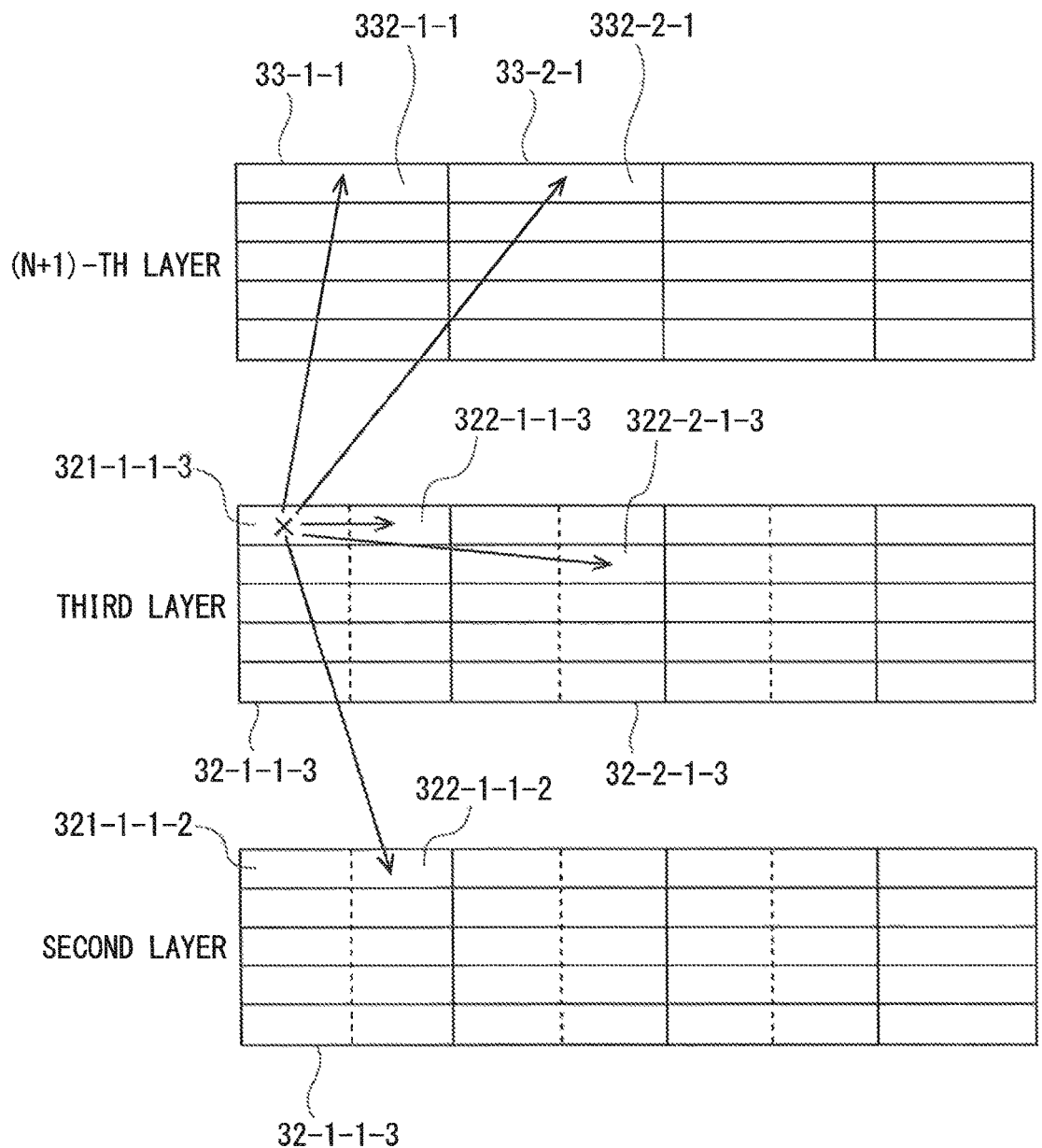
FIG. 16 illustrates an example of the redundant processing (2)

For example, as illustrated in FIG. 16, when a defect has occurred at the memory block unit 321-1-1-3 of the memory unit 32-1-1-3 in the third layer, it is determined whether or not there is free capacity in the redundant block unit 322-1-1-3 of the memory unit 32-1-1-3. For example, when there is free capacity in the redundant block unit 322-1-1-3 of the memory unit 32-1-1-3, the redundant block unit 322-1-1-3 of the memory unit 32-1-1-3 is used.

According to the redundant processing (2), the redundant block unit 322 of the memory unit 32 (where a defect has occurred) can be used as a substitute block unit which is substituted for the memory block unit 321 of the memory unit 32 (where a defect has occurred).

When there is no free capacity in the redundant block unit 322-1-1-3 of the memory unit 32-1-1-3, free capacity of the redundant block units 322 of the memory units 32 is checked. For example, when there is free capacity in the redundant block unit 322-1-1-2 of the memory unit 32-1-1-2 in the second layer, the redundant block unit 322-1-1-2 of the memory unit 32-1-1-2 is used. Therefore, the redundant block unit 322-1-1-2 of the memory unit 32-1-1-2 in the same group as the group of the memory unit 32-1-1-3 having the memory block unit 321-1-1-3 where a defect has occurred is used. For example, when there is free capacity in the redundant block unit 322-2-1-3 of the memory unit 32-2-1-3 in the third layer, the redundant block unit 322-2-1-3 of the memory unit 32-2-1-3 is used. Therefore, the redundant block unit 322-2-1-3 of the memory unit 32-2-1-3 in a different group from the group of the memory unit 32-1-1-3 having the memory block unit 321-1-1-3 where a defect has occurred is used.

According to the redundant processing (2), the redundant block unit 322 of the memory unit 32 in the group which is the same as or different from the group of the memory unit 32 (where a defect has occurred) can be used as the substitute block unit which is substituted for the memory block unit 321 of the memory unit 32 (where a defect has occurred).

When none of the redundant block units 322 of the memory units 32 has free capacity, free capacity of the redundant block units 332 of the redundant units 33 is checked. For example, when there is free capacity in the redundant block unit 332-1-1 of the redundant unit 33-1-1 in the (n+1)-th layer, the redundant block unit 332-1-1 of the redundant unit 33-1-1 is used. Therefore, the redundant block unit 332-1-1 of the redundant unit 33-1-1 in the same group as the group of the memory unit 32-1-1-3 having the memory block unit 321-1-1-3 where a defect has occurred is used. For example, when there is free capacity in the redundant block unit 332-2-1 of the redundant unit 33-2-1 in the (n+1)-th layer, the redundant block unit 332-2-1 of the redundant unit 33-2-1 is used. Therefore, the redundant block unit 332-2-1 of the redundant unit 33-2-1 in a different group from the group of the memory unit 32-1-1-3 having the memory block unit 321-1-1-3 where a defect has occurred is used.

According to the redundant processing (2), the redundant block unit 332 of the redundant unit 33 in the group which is the same as or different from the group of the memory unit 32 (where a defect has occurred) can be used as a substitute block unit which is substituted for the memory block unit 321 of the memory unit 32 (where a defect has occurred).

While in the above description, an example has been described where if none of the redundant block units 322 of the memory units 32 has free capacity, free capacity of the redundant block units 332 of the redundant units 33 are checked, the embodiments are not limited to this example. For example, it is also possible to check free capacity of the redundant block units 332 of the redundant units 33 before checking free capacity of the redundant block units 322 of the memory units 32. When there is free capacity in the redundant block unit 332 of the redundant unit 33, the redundant block unit 332 of the redundant unit 33 may be used. Further, it is also possible to check free capacity of the redundant block units 322 of the memory units 32 and free capacity of the redundant block units 332 of the redundant units 33 through the same processing. When there is free capacity in the redundant block unit 322 of the memory unit 32 and the redundant block unit 332 of the redundant unit 33, either one of the redundant block units 322 and 332 having free capacity may be selected.

According to the embodiments, because a CS signal is transmitted to the memory unit 32 and the redundant unit 33 through wireless connection, it is possible to easily access the memory unit 32 and the redundant unit 33. According to the embodiments, when a defect has occurred at the memory block unit 321 of the memory unit 32, it is possible to easily address occurrence of a defect at the memory block unit 321 of the memory unit 32 and improve continuation of the operation of the memory 3.

<Initial Setting Processing (2)>

Figure 17:
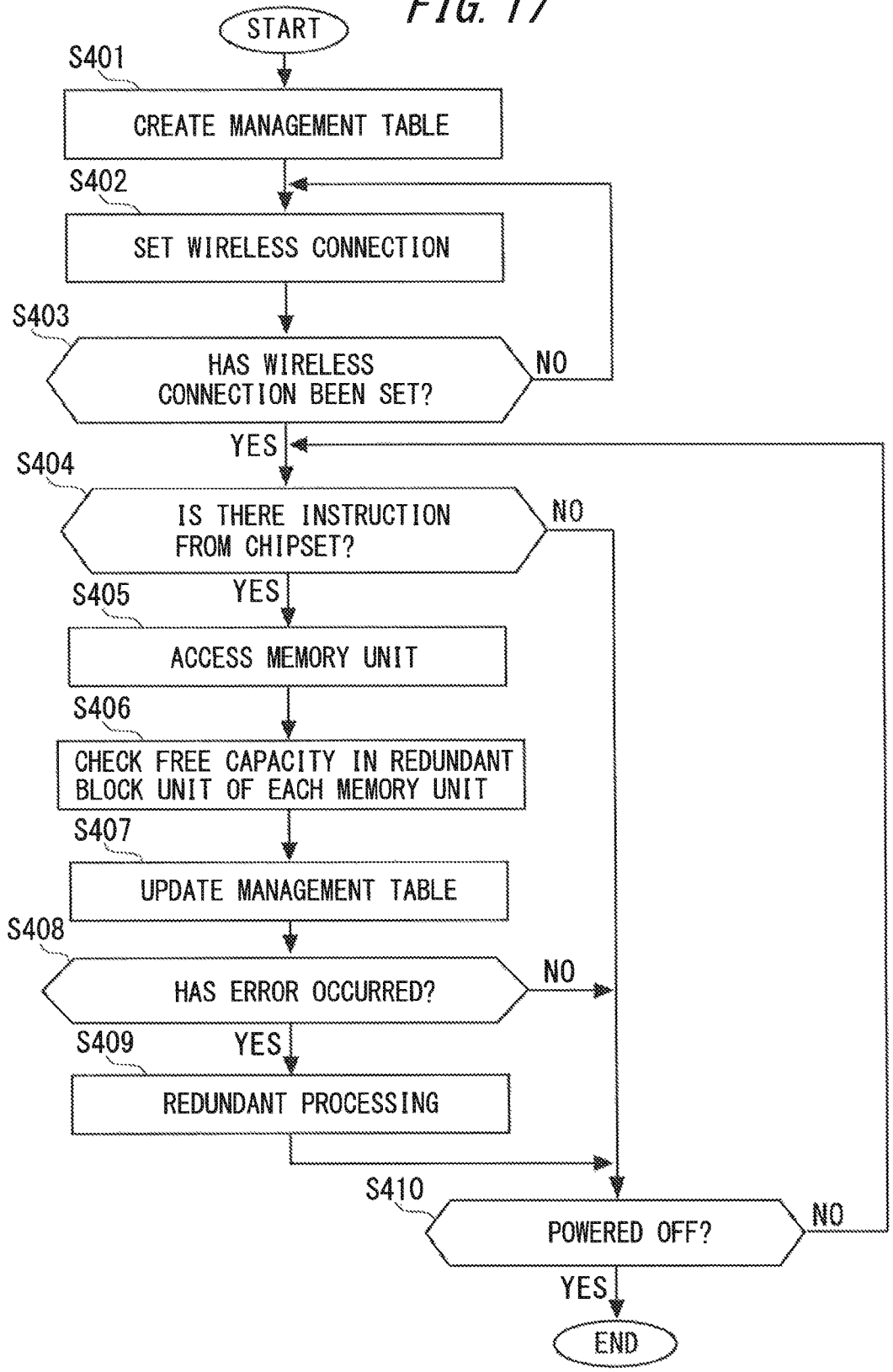
FIG. 17 is a flowchart illustrating initial setting processing (2)

The initial setting processing (2) will be described with reference to FIG. 17. FIG. 17 is a flowchart illustrating the initial setting processing (2).

In the initial setting processing (2) illustrated in FIG. 17, it is checked in advance whether or not there is free capacity in the redundant block units 322 of the memory units 32, and whether or not there is free capacity in the redundant block units 322 of the memory units 32 is recorded in the management table.

Because the processing of steps S401 to S405 in the flow of the initial setting processing (2) illustrated in FIG. 17 are the same as the processing of steps S101 to S105 in the flow of the initial setting processing (1) illustrated in FIG. 7, the explanation thereof will be omitted. Therefore, the processing of steps S406 to S410 in the flow of the initial setting processing (2) illustrated in FIG. 17 will be described.

The control unit 311 checks free capacity in the redundant block units 322 of the memory units 32 and determines whether or not there is free capacity in the redundant block units 322 of the memory units 32 (S406). For example, the control unit 311 may determine whether there is free capacity in the redundant block unit 322 of the memory unit 32 according to whether or not free capacity of the redundant block unit 322 of the memory unit 32 is greater than a predetermined value. The memory unit 32 which becomes a target of determination (judgment) includes the memory unit 32 in the same group (own group) as the group of the target memory unit 32 and the memory unit 32 in a different group (other group) from the group of the target memory unit 32.

The managing unit 314 updates the management table by recording information indicating a state of use of the redundant block unit 322 of the memory unit 32 in the management table (S407). In this case, a state of use of the redundant block unit 322 of the target memory unit 32 and a state of use of the redundant block units 322 of all the memory units 32 except the target memory unit 32 are recorded in the management table.

Check unit 315 checks whether or not a defect (an error) has occurred at the memory block unit 321 of the target memory unit 32 (S408). When a defect has occurred at the memory block unit 321 of the target memory unit 32 (S408; Yes), redundant processing is performed (S409). Meanwhile, when a defect has not occurred at the memory block unit 321 of the target memory unit 32 (S408; No), the processing proceeds to S410.

The control unit 311 determines whether or not the information processing device 1 has been powered off (S410). When the information processing device 1 has been powered off (S410; Yes), the flow of the initial setting processing (2) illustrated in FIG. 17 is finished. Meanwhile, when the information processing device 1 has not been powered off (S410; No), the processing returns to step S404. The processing may return to step S401 or S403 when a result of the determination in step S410 is No.

When the initial setting processing (2) illustrated in FIG. 17 is performed, in the processing of step S201 of FIG. 9 and the processing of step S301 of FIG. 13, the control unit 311 determines whether or not there is free capacity in the redundant block unit 322 of the memory unit (where a defect has occurred) with reference to the management table. The information indicating the state of use of the redundant block units 322 of the memory units 32 is recorded in the management table. Therefore, the control unit 311 can determine whether or not there is free capacity in the redundant block unit 322 of the memory unit 32 (where a defect has occurred) with reference to the management table.

When the initial setting processing (2) illustrated in FIG. 17 is performed, in the processing of step S303 of FIG. 13, the control unit 311 determines whether or not there is free capacity in at least one of the redundant block units 322 of the other memory units 32 with reference to the management table. The information indicating the state of use of the redundant block units 322 of the memory units 32 is recorded in the management table. Therefore, the control unit 311 can determine whether or not there is free capacity in at least one of the redundant block units 322 of the other memory units 32 with reference to the management table.

In the above description, an example has been described where when the memory unit 32 is accessed, the communication unit 312 wirelessly transmits an ID of the receiving unit 323 of the target memory unit 32 to the memory unit 32 as a CS signal. The embodiments are not limited to this example, and the communication unit 312 may wirelessly transmit the CS signal to the target memory unit 32 and not wirelessly transmit the CS signal to the memory units 32 other than the target memory unit 32. For example, the communication unit 312 wirelessly transmits the CS signal to each memory unit 32 using different frequencies, so that the receiving unit 323 of the target memory unit 32 receives the CS signal while the receiving units 323 of the memory units 32 other than the target memory unit 32 do not receive the CS signal.

The CS signal received by the receiving unit 323 of the target memory unit 32 may be stored in a holding unit 324 of the target memory unit 32. In this case, after the CS signal is stored in the holding unit 324 of the target memory unit 32, the communication unit 312 may prevent the CS signal from being wirelessly transmitted to the target memory unit 32. Further, the communication unit 312 may wirelessly transmit the CS signal to the target memory unit 32 continuously, and the receiving unit 323 of the target memory unit 32 may continuously receive the CS signal.

Because the receiving unit 323 of the target memory unit 32 receives the CS signal, the target memory unit 32 receives an AD signal, a BA signal, a DQ signal, and the like transmitted from the control unit 311. Meanwhile, because the receiving units 323 of the memory units 32 other than the target memory unit 32 do not receive the CS signal, the memory units 32 other than the target memory unit 32 do not receive an AD signal, a BA signal, a DQ signal, and the like transmitted from the control unit 311. In this case, the ID of the receiving unit 323 is not stored in the holding unit 324 of the memory unit 32.

Figure 18:
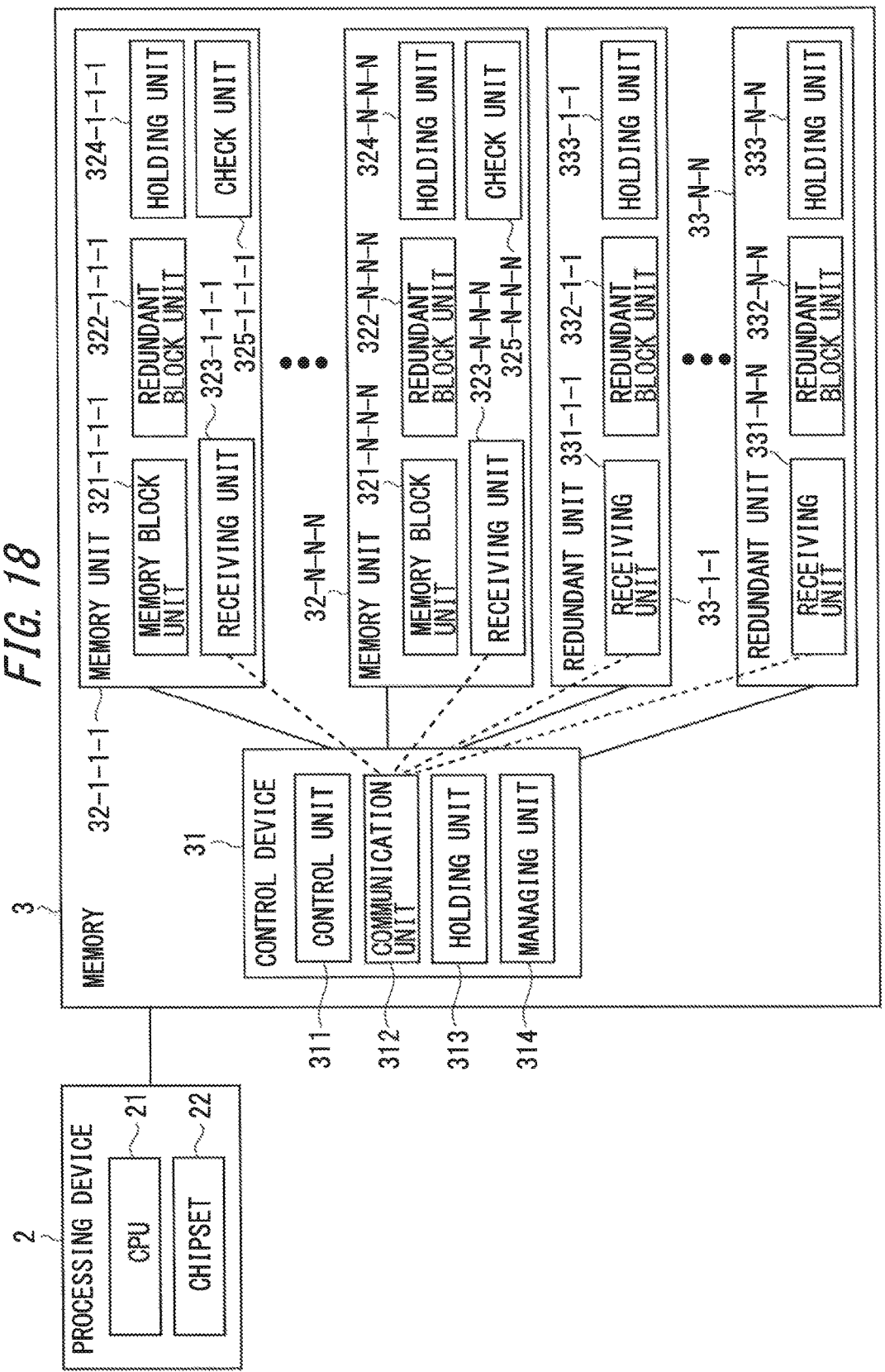
FIG. 18 illustrates an example of a memory system of the information processing device.

In the above description, an example has been described where the check unit 315 of the control device 31 checks whether or not a defect has occurred at the memory block unit 321 of the memory unit 32. The embodiments are not limited to this, and each memory unit 32 may check whether or not a defect has occurred at each memory block unit 321 of each memory unit 32. For example, as illustrated in FIG. 18, the memory unit 32-1-1-1 may have a check unit 325-1-1-1. Likewise, the memory units 32-1-1-2 to 32-N-N-N may have check units 325-1-1-2 to 325-N-N-N. FIG. 18 illustrates an example of the memory system of the information processing device 1.

In the following description, all of the check units 325-1-1-1 to 325-N-N-N may be described as the check units 325. One of the check units 325-1-1-1 to 325-N-N-N may be described as the check unit 325. Each of the check units 325-1-1-1 to 325-N-N-N may be described as each check unit 325.

Each check unit 325 of each memory unit 32 checks whether or not a defect has occurred at each memory block unit 321 of each memory unit 32. Each check unit 325 of each memory unit 32 stores whether or not a defect has occurred at each memory block unit 321 of each memory unit 32 in each holding unit 324 of each memory unit 32. In the flow of the initial setting processing (1) illustrated in FIG. 7, in step S106, the check unit 325 of the target memory unit 32 checks whether or not a defect has occurred at the memory block unit 321 of the target memory unit 32. In the flow of the initial setting processing (2) illustrated in FIG. 17, in step S408, the check unit 325 of the target memory unit 32 checks whether or not a defect has occurred at the memory block unit 321 of the target memory unit 32.

Figure 19:
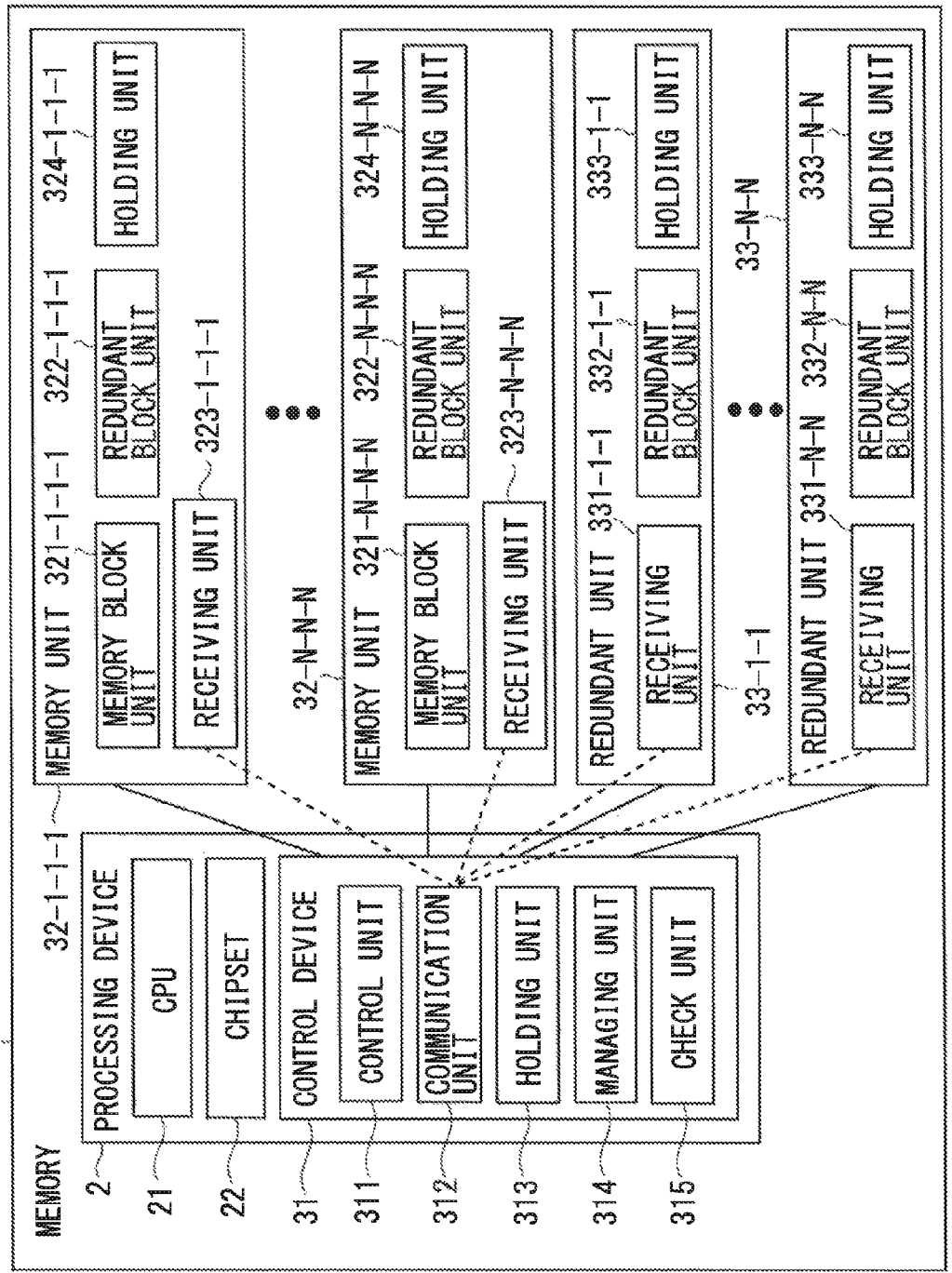
FIG. 19 illustrates an example of the memory system of the information processing device.

In the above description, an example has been described where the processing device 2 is connected to the memory 3 via the bus. The embodiments are not limited to this example, and the processing device 2 may be incorporated into the memory 3. For example, as illustrated in FIG. 19, the memory 3 may have the processing device 2, and the processing device 2 may have the CPU 21, the chipset 22 and the control device 31. FIG. 19 illustrates an example of the memory system of the information processing device 1. Further, the memory system of the information processing device 1 illustrated in FIG. 18 and the memory system of the information processing device 1 illustrated in FIG. 19 may be combined. For example, in the memory system of the information processing device 1 illustrated in FIG. 19, each memory unit 32 may have each check unit 325.

In the above description, after the control unit 311 accesses the memory unit 32, the check unit 315 checks whether or not a defect has occurred at the memory block unit 321 of the target memory unit 32 (S106 in FIG. 7 and S408 in FIG. 17). The embodiments are not limited to these examples, and the check unit 315 may check whether or not a defect has occurred at the memory block unit 321 of the target memory unit 32 upon activation of the information processing device 1 or upon activation of the memory 3.

That is, the check unit 315 may detect a defect of the memory block unit 321 of the target memory unit 32 upon activation of the information processing device 1 or upon activation of the memory 3.

In the above description, after the control unit 311 accesses the memory unit 32, the redundant processing is performed (S107 in FIG. 7 and S409 in FIG. 17). The embodiments are not limited to these examples, and the redundant processing may be performed upon activation of the information processing device 1 or upon activation of the memory 3.

The control unit 311 may determine whether or not there is free capacity in the redundant block unit 322 of the memory unit 32 having the memory block unit 321 where a defect has occurred upon activation of the information processing device 1 or upon activation of the memory 3. That is, the processing of S201 in FIG. 9 or the processing of S301 in FIG. 13 may be performed upon activation of the information processing device 1 or upon activation of the memory 3. The control unit 311 may determine the redundant block unit 322 having free capacity in the memory unit 32 (where a defect has occurred) as a substitute block unit which is substituted for the memory block unit 321 of the memory unit 32 (where a defect has occurred) upon activation of the information processing device 1 or upon activation of the memory 3. That is, the processing of S202 in FIG. 9 or the processing of S302 in FIG. 13 may be performed upon activation of the information processing device 1 or upon activation of the memory 3.

The control unit 311 may determine whether or not there is free capacity in at least one of the redundant block units 332 of the redundant units 33 upon activation of the information processing device 1 or upon activation of the memory 3. That is, the processing of S203 in FIG. 9 or the processing of S305 in FIG. 13 may be performed upon activation of the information processing device 1 or upon activation of the memory 3. The control unit 311 may determine the redundant block unit 332 having free capacity in the redundant unit 33 as a substitute block unit which is substituted for the memory block unit 321 of the memory unit (where a defect has occurred) upon activation of the information processing device 1 or upon activation of the memory 3. That is, the processing of S207 in FIG. 9 or the processing of S309 in FIG. 13 may be performed upon activation of the information processing device 1 or upon activation of the memory 3.

The control unit 311 may determine whether or not there is free capacity in at least one of the redundant block units 322 of the other memory units 32 upon activation of the information processing device 1 or upon activation of the memory 3. That is, the processing of S303 in FIG. 13 may be performed upon activation of the information processing device 1 or upon activation of the memory 3. The control unit 311 may determine the redundant block unit 322 having free capacity in the other memory units 32 as a substitute block which is substituted for the memory block unit 321 of the memory unit 32 (where a defect has occurred) upon activation of the information processing device 1 or upon activation of the memory 3. That is, the processing of S304 in FIG. 13 may be performed upon activation of the information processing device 1 or upon activation of the memory 3.

The managing unit 314 may update the management table upon activation of the information processing device 1 or upon activation of the memory 3. That is, the processing of S208 in FIG. 9 or the processing of S310 in FIG. 13 may be performed upon activation of the information processing device 1 or upon activation of the memory 3.

The communication unit 312 may set wireless connection with the receiving unit 331 of the redundant unit 33 according to the management table upon activation of the information processing device 1 or upon activation of the memory 3. That is, the processing of S205 in FIG. 9 or the processing of S307 in FIG. 13 may be performed upon activation of the information processing device 1 or upon activation of the memory 3.

Figure 20:
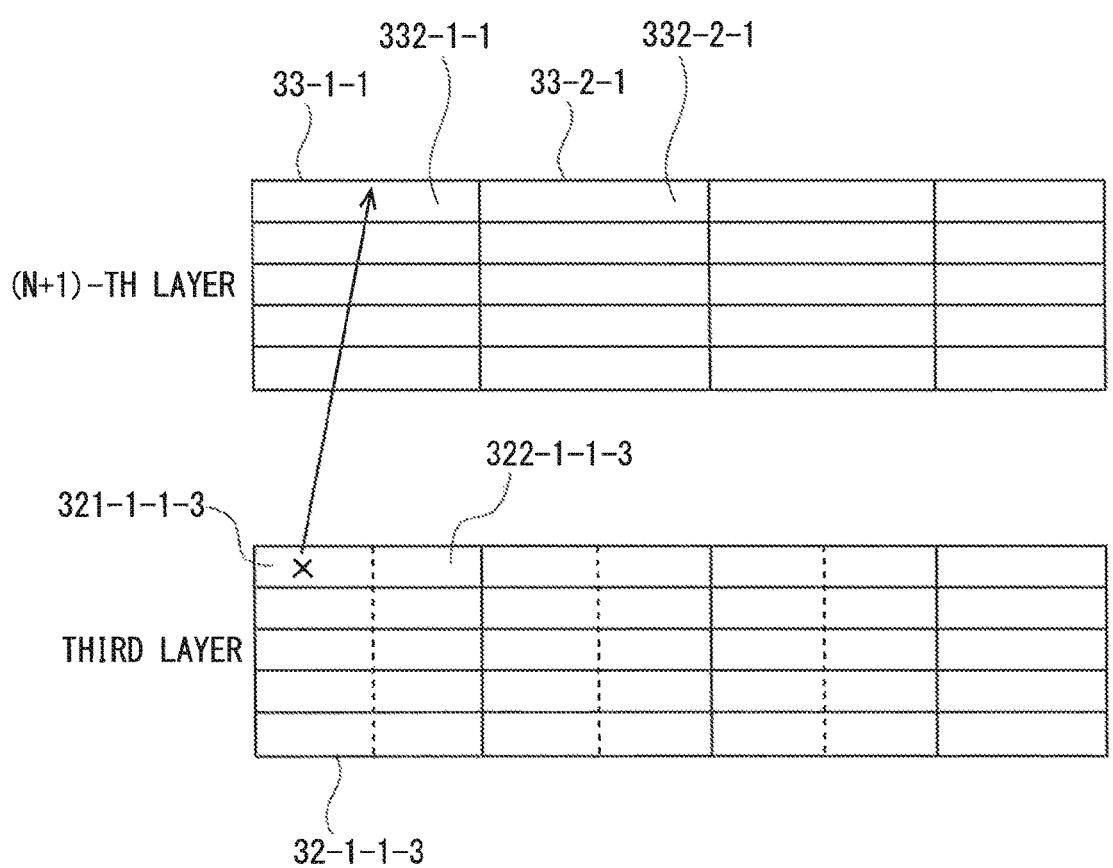
FIG. 20 illustrates redundant processing in a reference example.

The managing unit 314 may determine whether wireless connection is set between the communication unit 312 and the receiving unit 331 of the redundant unit 33 upon activation of the information processing device 1 or upon activation of the memory 3. That is, the processing of S206 in FIG. 9 or the processing of S308 in FIG. 13 may be performed upon activation of the information processing device 1 or upon activation of the memory 3. FIG. 20 illustrates redundant processing in a reference example. In the reference example, a defect has occurred at the memory block unit 321-1-1-3 of the memory unit 32-1-1-3 in the third layer. Only the redundant block unit 332 of the redundant unit 33 in the same group as the group of the memory unit 32 (where a defect has occurred) can be used as a substitute block unit which is substituted for the memory block unit 321 of the memory unit (where a defect has occurred). That is, in the reference example, the redundant block unit 332 of the redundant unit 33 in a different group from the group of the memory unit 32 (where a defect has occurred) is not usable as the substitute block unit which is substituted for the memory block unit 321 of the memory unit 32 (where a defect has occurred). In the reference example, when a defect has occurred at the memory block unit 321-1-1-3 of the memory unit 32-1-1-3 in the third layer and there is no free capacity in the redundant block unit 332-1-1 of the redundant unit 33-1-1, the memory 3 will be replaced.

According to the embodiments, it is possible to improve continuation of operation of a stacked memory in a case where a defect has occurred at the stacked memory.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions have been described in detail, it should be understood that the various changes, substitutions, and alterations could be made hereto without departing from the spirit and scope of the invention.

What is claimed is:

1. A memory device comprising:
    a storage unit in which a plurality of semiconductor chips each comprising a plurality of memory blocks respectively arranged in a planar direction and a plurality of redundant blocks respectively arranged in the planar direction are stacked;
    a detecting unit configured to detect a defect of each of the memory blocks in the storage unit;
    a checking unit configured to check free capacity in each of the redundant blocks in the storage unit;
    a determining unit configured to determine a substitute block to be substituted for the memory block in which the defect has been detected from the redundant blocks having the free capacity; and
    a control unit configured to access the storage unit,
    the detecting unit detects the defect upon activation of the memory device,
    the checking unit checks the free capacity in the redundant blocks upon activation of the memory device,
    the determining unit determines the substitute block upon activation of the memory device and creates a table defining a correspondence relationship between the memory block in which the defect has been detected and the substitute block, and
    the control unit accesses the storage unit with reference to the table.

2. The memory device according to claim 1, wherein a control signal for accessing the storage unit is wirelessly transmitted.

3. A storage method performed by a memory device, the storage method comprising:
    in a storage unit in which a plurality of semiconductor chips each comprising a plurality of memory blocks respectively arranged in a planar direction and a plurality of redundant blocks respectively arranged in the planar direction are stacked, detecting a defect of each of the memory blocks;
    checking free capacity in each of the redundant blocks in the storage unit; and
    determining a substitute block to be substituted for the memory block in which the defect has been detected from the redundant blocks having the free capacity,
    the defect is detected upon activation of the memory device,
    the free capacity in the redundant blocks is checked upon activation of the memory device,
    the substitute block is determined upon activation of the memory device and a table defining a correspondence relationship between the memory block at which the defect has been detected and the substitute block is created, and
    the storage unit is accessed with reference to the table.

4. The storage method according to claim 3, wherein a control signal for accessing the storage unit is wirelessly transmitted.

5. A control device comprising:
    a storage unit in which a plurality of semiconductor chips each comprising a plurality of memory blocks respectively arranged in a planar direction and a plurality of redundant blocks respectively arranged in the planar direction are stacked;
    a detecting unit configured to detect a defect of each of the memory blocks in the storage unit;
    a checking unit configured to check free capacity in each of the redundant blocks in the storage unit;
    a determining unit configured to determine a substitute block to be substituted for the memory block in which the defect has been detected from the redundant blocks having the free capacity; and
    a control unit configured to access the storage unit,
    the detecting unit detects the defect upon activation of the memory device,
    the checking unit checks the free capacity in the redundant blocks upon activation of the memory device,
    the determining unit determines the substitute block upon activation of the memory device and creates a table defining a correspondence relationship between the memory block in which the defect has been detected and the substitute block, and
    the control unit accesses the storage unit with reference to the table.

6. The control device according to claim 5, wherein a control signal for accessing the storage unit is wirelessly transmitted.

7. The memory device according to claim 1, wherein the plurality of semiconductor chips includes a plurality of first semiconductor chips and a second semiconductor chip,
- each of the plurality of first semiconductor chips includes the plurality of memory blocks respectively arranged in the planar direction,
- the second semiconductor chip includes the plurality of redundant blocks respectively arranged in the planar direction are stacked.

8. The storage method according to claim 3, wherein the plurality of semiconductor chips includes a plurality of first semiconductor chips and a second semiconductor chip,
- each of the plurality of first semiconductor chips includes the plurality of memory blocks respectively arranged in the planar direction,
- the second semiconductor chip includes the plurality of redundant blocks respectively arranged in the planar direction are stacked.

9. The control device according to claim 5, wherein the plurality of semiconductor chips includes a plurality of first semiconductor chips and a second semiconductor chip,
- each of the plurality of first semiconductor chips includes the plurality of memory blocks respectively arranged in the planar direction,
- the second semiconductor chip includes the plurality of redundant blocks respectively arranged in the planar direction are stacked.

* * * * *